United States Patent
Birtcher et al.

(10) Patent No.: US 9,598,766 B2
(45) Date of Patent: Mar. 21, 2017

(54) VESSEL WITH FILTER

(71) Applicant: AIR PRODUCTS AND CHEMICALS INC., Allentown, PA (US)

(72) Inventors: Charles Michael Birtcher, Valley Center, CA (US); Thomas Andrew Steidl, Escondido, CA (US); Xinjian Lei, Vista, CA (US); Sergei Vladimirovich Ivanov, Schnecksville, PA (US)

(73) Assignee: AIR PRODUCTS AND CHEMICALS, INC., Allentown, PA (US)

( * ) Notice: Subject to any disclaimer, the term of this patent is extended or adjusted under 35 U.S.C. 154(b) by 619 days.

(21) Appl. No.: 13/897,967

(22) Filed: May 20, 2013

(65) Prior Publication Data

US 2013/0312855 A1  Nov. 28, 2013

Related U.S. Application Data

(60) Provisional application No. 61/652,236, filed on May 27, 2012, provisional application No. 61/764,851, filed on Feb. 14, 2013.

(51) Int. Cl.
| | |
|---|---|
| *C23C 16/44* | (2006.01) |
| *H01L 21/02* | (2006.01) |
| *C23C 16/455* | (2006.01) |
| *C23C 16/448* | (2006.01) |
| *B01D 7/00* | (2006.01) |

(52) U.S. Cl.
CPC ............ *C23C 16/4402* (2013.01); *B01D 7/00* (2013.01); *C23C 16/4412* (2013.01); *C23C 16/4481* (2013.01); *C23C 16/4485* (2013.01); *C23C 16/455* (2013.01); *H01L 21/0262* (2013.01); *Y10T 137/4891* (2015.04); *Y10T 137/794* (2015.04)

(58) Field of Classification Search
CPC ............ C23C 16/4402; C23C 16/4481; C23C 16/4412; B01D 7/00
See application file for complete search history.

(56) References Cited

U.S. PATENT DOCUMENTS

| | | | |
|---|---|---|---|
| 4,723,967 A * | 2/1988 | Tom .................. | B01D 53/0407 137/205.5 |
| 4,738,693 A | 4/1988 | Tom | |
| 4,916,828 A | 4/1990 | Yamane et al. | |

(Continued)

FOREIGN PATENT DOCUMENTS

| | | |
|---|---|---|
| EP | 1630859 | 3/2006 |
| EP | 1669474 | 6/2006 |

(Continued)

*Primary Examiner* — Atif Chaudry
(74) *Attorney, Agent, or Firm* — Lina Yang

(57) ABSTRACT

A vessel for conveying a precursor-containing fluid stream from a precursor material contained within the vessel, the vessel comprising: an interior volume defined by a top, one or more sidewalls, and a base; and at least one fluid outlet for vaporized precursor, and at least one particle barrier that defines at least one particle restricted space within the interior volume, wherein said particle barrier comprises at least one 3-dimensional filter. A method for using the apparatus is also disclosed.

5 Claims, 13 Drawing Sheets

(56) References Cited

U.S. PATENT DOCUMENTS

| | | | |
|---|---|---|---|
| 4,984,597 A | 1/1991 | McConnell et al. | |
| 5,037,624 A * | 8/1991 | Tom | B01D 53/02 422/180 |
| 5,069,244 A | 12/1991 | Miyazaki et al. | |
| 5,480,677 A | 1/1996 | Li et al. | |
| 5,674,574 A | 10/1997 | Atwell et al. | |
| 5,980,744 A * | 11/1999 | Gagnon | B01D 29/111 210/457 |
| 6,202,591 B1 | 3/2001 | Witzman et al. | |
| 6,424,800 B1 | 7/2002 | Kim | |
| 6,431,229 B1 | 8/2002 | Birtcher et al. | |
| 6,444,038 B1 | 9/2002 | Rangarajan et al. | |
| 6,635,114 B2 | 10/2003 | Zhao et al. | |
| 6,718,126 B2 | 4/2004 | Lei | |
| 6,764,387 B1 | 7/2004 | Chen | |
| 6,905,541 B2 | 6/2005 | Chen et al. | |
| 6,915,592 B2 | 7/2005 | Guenther | |
| 6,921,062 B2 | 7/2005 | Gregg et al. | |
| 6,936,906 B2 | 8/2005 | Chung et al. | |
| 6,984,415 B2 | 1/2006 | McFeely et al. | |
| 7,036,801 B2 | 5/2006 | Takamatsu et al. | |
| 7,049,226 B2 | 5/2006 | Chung et al. | |
| 7,186,385 B2 | 3/2007 | Ganguli et al. | |
| 7,261,118 B2 | 8/2007 | Birtcher et al. | |
| 7,270,709 B2 | 9/2007 | Chen et al. | |
| 7,300,038 B2 | 11/2007 | Gregg et al. | |
| 7,352,048 B2 | 4/2008 | Chung et al. | |
| 7,429,361 B2 | 9/2008 | Ganguli et al. | |
| 7,464,917 B2 | 12/2008 | Lee et al. | |
| 7,487,956 B2 | 2/2009 | Gregg et al. | |
| 7,494,908 B2 | 2/2009 | Chung et al. | |
| 7,524,374 B2 | 4/2009 | Chen et al. | |
| 7,556,244 B2 | 7/2009 | Gregg et al. | |
| 7,562,672 B2 | 7/2009 | Nakashima et al. | |
| 7,568,495 B2 | 8/2009 | Nakashima et al. | |
| 7,569,191 B2 | 8/2009 | Ganguli et al. | |
| 7,588,736 B2 | 9/2009 | Chen et al. | |
| 7,597,758 B2 | 10/2009 | Chen et al. | |
| 7,601,225 B2 | 10/2009 | Tuominen et al. | |
| 7,678,194 B2 | 3/2010 | Ganguli et al. | |
| 7,699,023 B2 | 4/2010 | Chen et al. | |
| 7,748,400 B2 | 7/2010 | Nakashima et al. | |
| 7,775,508 B2 | 8/2010 | Choi et al. | |
| 7,780,788 B2 | 8/2010 | Chen et al. | |
| 7,828,274 B2 | 11/2010 | Gregg et al. | |
| 7,832,432 B2 | 11/2010 | Nakashima et al. | |
| 8,002,247 B2 | 8/2011 | Birtcher et al. | |
| 8,062,422 B2 | 11/2011 | Chen et al. | |
| 8,128,073 B2 | 3/2012 | Gregg et al. | |
| 8,137,462 B2 | 3/2012 | Fondurulia et al. | |
| 8,137,468 B2 | 3/2012 | Choi et al. | |
| 8,162,296 B2 | 4/2012 | Birtcher et al. | |
| 8,821,640 B2 | 9/2014 | Cleary et al. | |
| 2003/0042630 A1 | 3/2003 | Babcoke et al. | |
| 2004/0025370 A1* | 2/2004 | Guenther | C23C 16/4481 34/576 |
| 2004/0058510 A1 | 3/2004 | Hyodo et al. | |
| 2005/0006799 A1 | 1/2005 | Gregg et al. | |
| 2006/0121198 A1* | 6/2006 | Shenai-Khatkhate | C23C 16/4481 427/255.28 |
| 2007/0072401 A1 | 3/2007 | Suzuki | |
| 2007/0079759 A1 | 4/2007 | Lee et al. | |
| 2008/0092816 A1 | 4/2008 | Birtcher et al. | |
| 2008/0143002 A1* | 6/2008 | Steidl | C23C 16/4482 261/122.1 |
| 2008/0191153 A1 | 8/2008 | Marganski et al. | |
| 2008/0268143 A1 | 10/2008 | Vahlas et al. | |
| 2009/0078203 A1 | 3/2009 | Soininen et al. | |
| 2009/0236447 A1 | 9/2009 | Panagopoulos et al. | |
| 2010/0009080 A1 | 1/2010 | Jan Snijders et al. | |
| 2010/0043918 A1 | 2/2010 | Birtcher et al. | |
| 2010/0237085 A1 | 9/2010 | Birtcher | |
| 2010/0269937 A1 | 10/2010 | Griffin | |
| 2012/0048182 A1 | 3/2012 | Arena et al. | |
| 2012/0266967 A1 | 10/2012 | Kanjolia et al. | |

FOREIGN PATENT DOCUMENTS

| | | |
|---|---|---|
| EP | 1923485 | 5/2008 |
| GB | 2223509 | 4/1990 |
| JP | 59169123 | 9/1984 |
| JP | 01184835 | 7/1989 |
| JP | 2614338 | 5/1997 |
| JP | 11193462 | 7/1999 |
| JP | 2000174005 | 6/2000 |
| JP | 02069389 | 3/2002 |
| JP | 2004115831 | 4/2004 |
| JP | 2004363562 | 12/2004 |
| JP | 2007100207 | 4/2007 |
| JP | 2009147356 | 7/2009 |
| JP | 2010502833 | 1/2010 |
| JP | 2010153741 | 7/2010 |
| JP | 2010199160 | 9/2010 |
| JP | 2012082527 | 4/2012 |
| KR | 1020010067405 | 7/2001 |
| KR | 1020080042032 | 5/2008 |
| KR | 20090061646 A | 6/2009 |
| KR | 1020100096033 | 9/2010 |

* cited by examiner

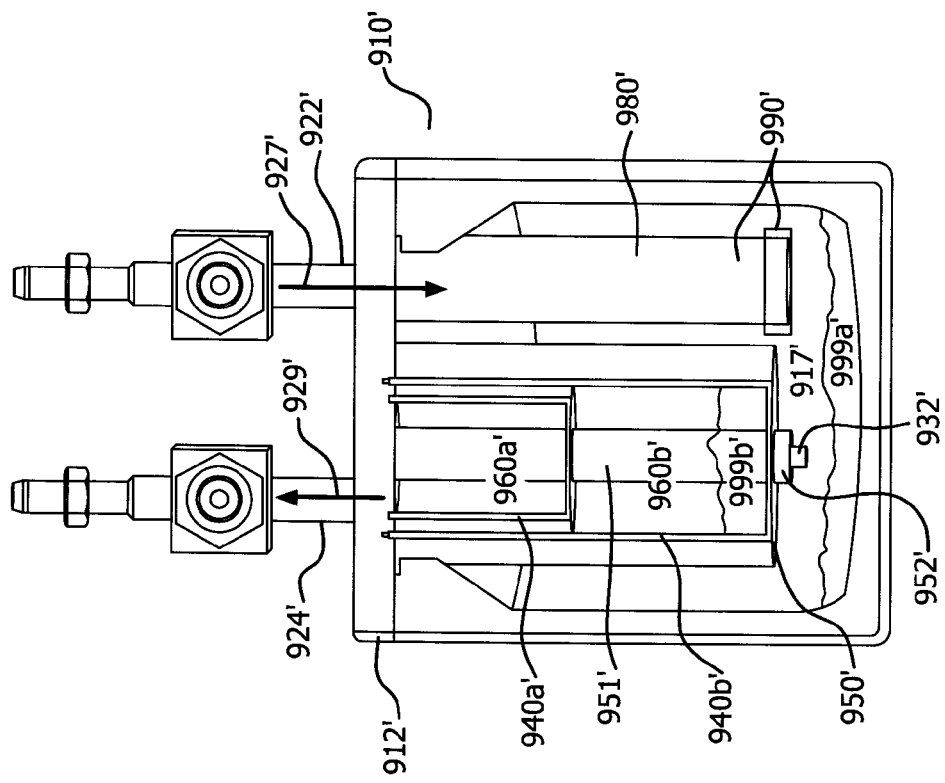
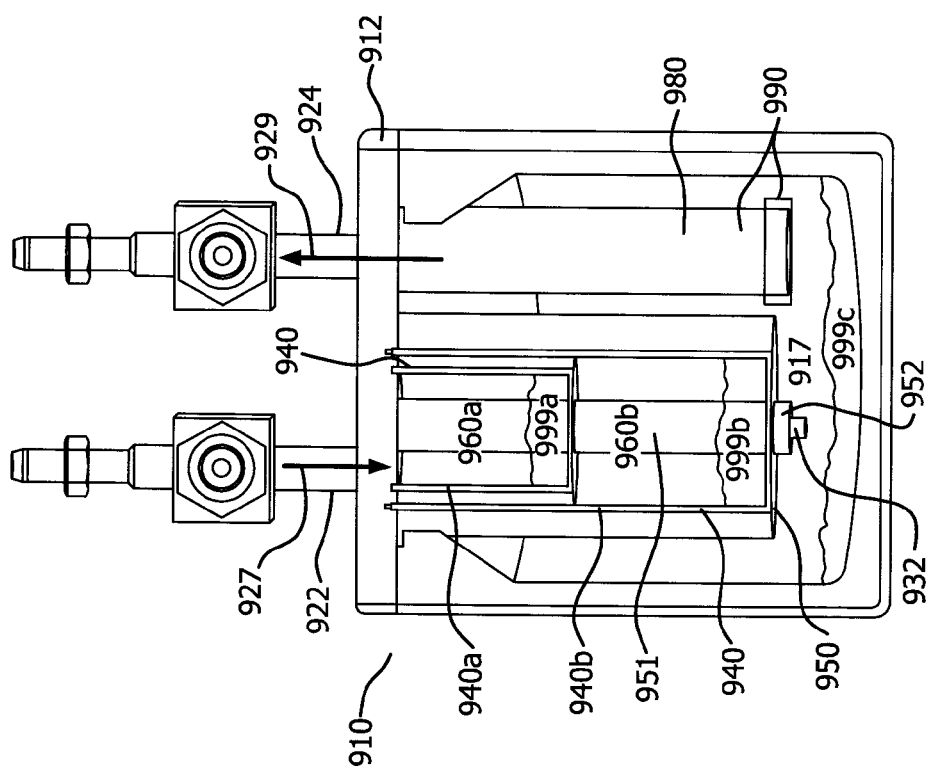

VESSEL WITH FILTER

CROSS-REFERENCE OF RELATED APPLICATIONS

This application claims priority to and benefit of U.S. Provisional Ser. No. 61/652,236, filed May 27, 2012, and U.S. Provisional Ser. No. 61/764,851, filed Feb. 14, 2013, which are incorporated herein by reference in their entirety.

BACKGROUND OF THE INVENTION

Deposition processes such as, for example, chemical vapor deposition (CVD) and atomic layer deposition (ALD) processes, are used in one or more steps during the manufacture of a semiconductor device to form one or more films or coatings on the surface of a substrate. In a typical CVD or ALD process, a precursor source that may be in a solid and/or liquid phase is conveyed to a reaction chamber having one of more substrates contained therein where the precursor reacts under certain conditions such as temperature or pressure to form the coating or film on the substrate surface.

When a solid precursor material is used in a CVD or ALD process, the precursor material is typically heated in a separate chamber such as an oven to a temperature sufficient to form a gas, which is then transported, typically in conjunction with a carrier gas, to the reaction chamber. In some instances, the solid precursor material is heated to its gaseous phase without forming an intermediate liquid phase. The vaporization of a solid precursor material presents difficulties in generating and conveying the precursor-containing vapor to the reaction chambers. Typical difficulties encountered include, but are not limited to, deposit buildup within the vessel, vaporizer and/or delivery lines; condensation of liquid- or solid-phase material within the vessel, vaporizer and/or delivery lines, formation of "cold spots" within the interior of the vessel; and inconsistent vapor flow to downstream reaction chambers. These difficulties may result in extended "down time" of the production equipment to remove liquid or particulate matter and may also produce relatively poor quality deposited films.

BRIEF SUMMARY OF THE INVENTION

Described herein is a vessel for conveying a precursor-containing fluid stream from a precursor material contained within the vessel, the vessel comprising an interior volume defined by a top, one or more sidewalls, and a base; and at least one fluid outlet for the vaporized precursor, and at least one particle barrier that defines at least part of at least one particle restricted space within the interior volume, wherein the at least one particle barrier comprises at least one 3-dimensional filter.

In one embodiment, the vessel described above further comprises at least one particle restricted space in fluid communication with the at least one outlet and in particle restricted fluid communication with a portion of the interior volume excluding the at least one particle restricted space in fluid communication with the at least one outlet.

Another embodiment is the vessel of any of the above embodiments, further comprising at least one inlet that directs at least one carrier gas into the interior volume of the vessel.

A further embodiment is the vessel of any of the embodiments above, wherein the at least one particle restricted space is in fluid communication with the at least one inlet and in particle restricted fluid communication with a portion of the interior volume excluding the at least one particle restricted space in communication with the at least one inlet.

Another embodiment is the vessel of any of the embodiments above, wherein the at least one particle restricted space comprises at least one first particle restricted space and at least one second particle restricted space, each of the at least one first and at least one second particle restricted spaces comprising at least one filter, wherein the at least one first particle restricted space is in fluid communication with the at least one fluid outlet and the at least one second particle restricted space is in fluid communication with the at least one fluid inlet, and the at least one first and second particle restricted spaces are in particle restricted fluid communication with the portion of the interior volume excluding the at least one first and second particle restricted spaces.

In any of the preceeding embodiments or in an alternative embodiment, the second particle barrier may comprise at least one 2-dimensional filter or at least one three dimensional filter. In any of the embodiments, the at least one particle barrier may be attached to one or more of the following: an inlet pipe that extends into the interior volume, an outlet pipe that extends into the interior volume, the one or more sidewalls, the top or the base. In any embodiment, the top may be a lid and at least one inlet and at least one outlet may pass through the lid. In any embodiment the filter may have a shape selected from the group consisting of: tubular, cup, bellows, cube, cone, hockey puck, and tubular loop. In any embodiment described herein, the at least one filter may have a surface area greater than 20 square inches or as otherwise described herein and/or a Volume Design Factor greater than or equal to 0.25 $inch^{-1}$ or as otherwise described herein and/or at least one filter in the vessel has a Surface Area Design Factor greater than 0.8 inch or as otherwise described herein. Further in any embodiment, the vessel may comprise multiple inlets and/or outlets, each of the inlets and/or outlets may have a particle barrier thereon. The at least one particle barrier in any of the vessels may further comprise one or more supports (for example between the one or more filter(s) used to construct the particle barrier) and optional attachment parts, such as brackets, fasteners, screws, bolts, and/or welds.

In yet another embodiment, described herein is a method for dispensing a precursor-containing fluid stream comprising a gaseous phase of a precursor from a vessel, the method comprising: providing a vessel comprising an interior volume defined by a top, one or more sidewalls, and a base; the vessel having a precursor in the interior volume and at least one fluid outlet for vaporized precursor, the vessel having at least one particle barrier that defines at least part of at least one particle restricted space within the interior volume, wherein the at least one particle barrier comprises at least one 3-dimensional filter; vaporizing the precursor to form the fluid stream, wherein the at least one particle barrier prevents particles in the fluid stream from passing into the at least one particle restricted space. The method may further be wherein the at least one particle restricted space is in fluid communication with the at least one outlet and in particle restricted fluid communication with the remainder of the interior volume and further comprising after the vaporizing step, the steps of passing the fluid stream through the at least one particle barrier from the interior volume into the at least one particle restricted space; and exiting the vessel with the fluid stream through the at least one outlet. Any embodiment of the method may further comprise introducing at least one carrier gas into the vessel through at least one inlet wherein the at least one carrier gas and the gaseous phase of the precursor combine to form the fluid stream.

Additionally in any embodiments of the method, the method may further comprise the step of flowing the at least one carrier gas through at least one second particle restricted space in fluid communication with the at least one inlet, the second particle restricted space comprising at least one particle barrier located in the interior volume of the vessel, and/or the precursor may be located at or near the base of the container and/or the carrier gas may flows from the at least one inlet that passes through the lid towards the base of the vessel.

Additionally any embodiments of the method may further comprise prior to the vaporizing step, the step of preparing a solid precursor in a vessel, by: (a) heating the precursor under conditions to sinter loose precursor particles into a solid; (b) heating the precursor under conditions to allow the solid precursor to melt and cooling the precursor below the precursor's melting point to form a solid; or (c) introducing the precursor dissolved in a solvent into the vessel; and heating the precursor under conditions sufficient to remove residual solvent to form a solid.

The vessels and methods described herein provide one or more of the following benefits, one being that the surface area of the filters used prior to this invention were too small for the intended flow rates therethrough causing transport and entrainment of precursor onto the filter surface causing increasing pressure drop (across the filter) and often culminating in undesirable clogging of the filters. The large surface area of the 3-dimensional filters used in this invention provide for relatively lower pressure drops across them and reduced clogging.

BRIEF DESCRIPTION OF SEVERAL VIEWS OF THE DRAWINGS

FIG. 3b is an assembled, isometric view of the lid in FIG. 3a.

FIG. 3c is a top view of the lid in FIG. 3a.

FIG. 13 provides a side view of an embodiment of a multiple cup-shaped particle barrier wherein the inlet gas flows initially into the cup-shaped particle barrier comprising the precursor.

FIG. 14 provides a side view of an embodiment of a multiple cup-shaped particle barrier which has the reverse carrier gas flow as the embodiment presented in FIG. 13.

DETAILED DESCRIPTION OF THE INVENTION

Figure 2:
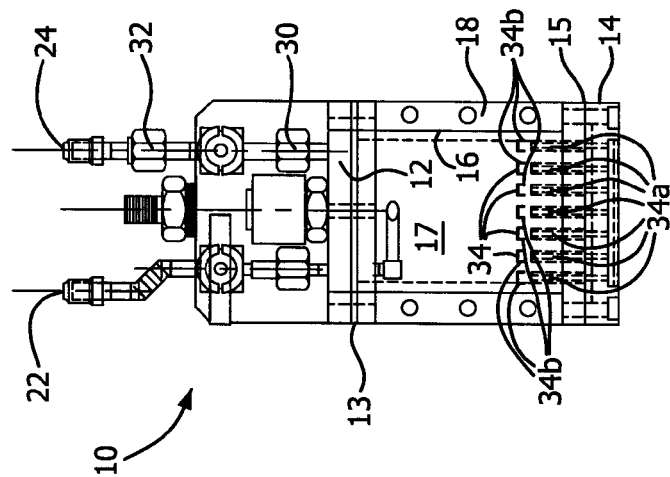
FIG. 2 provides an assembled side view of the prior art vessel of FIG. 1 illustrating the interior volume.

A vessel for the vaporization and/or sublimation of a precursor material, particularly a solid precursor, and a method comprising same are disclosed herein. The vessel is typically constructed of a vessel having a base, top (which may be a lid), and sidewall that define an interior volume to contain the precursor material. The use of the word vaporization (or vaporizing) herein includes vaporization and/or sublimation of the precursor wherever it is used. Upon application of heat and/or reduced pressure, the precursor material may transform from a solid and/or liquid phase to its gaseous phase.

The precursor material may be a solid and/or a liquid which can be delivered at one or more temperatures ranging from room temperatures to 400° C., preferably from 50 to 250° C. In certain preferred embodiments, the precursor material is a solid. Examples of precursor materials that may be used in the vessel described herein include, but are not limited to, hafnium chloride ($HfCl_4$), zirconium chloride ($ZrCl_4$), indium trichloride ($InCl_3$), aluminum trichloride ($AlCl_3$), silicon iodide ($SiI_4$), titanium iodide ($TiI_4$), tantalum chloride ($TaCl_5$), tantalum bromide ($TaBr_5$), tantalum iodide ($TaI_5$), niobium chloride ($NbCl_5$), niobium bromide ($NbBr_5$), niobium iodide ($NbI_5$), tungsten chloride ($WCl_6$), tungsten bromide ($WBr_6$), molybdenum chloride ($MoCl_3$), molybdenum bromide ($MoBr_5$), metal carbonyls (for example tungsten carbonyl ($W(CO)_6$), ruthenium carbonyl), metal alkoxide (for example, aluminum ethoxide, lanthanum iso-propoxide, tantalum methoxide, titanium methoxide, zirconium ethoxide, zirconium iso-propoxide), metal β-diketonates such as bis(2,2,6,6-tetramethyl-3,5-heptanedionato) barium, bis(2,2,6,6-tetramethyl-3,5-heptanedionato) strontium), tetrakis(2,2,6,6-tetramethyl-3,5-heptanedionato) zirconium, tetrakis(2,2,6,6-tetramethyl-3,5-heptanedionato) cerium, tris(2,2,6,6-tetramethyl-3,5-heptanedionato) titanium, tris(2,2,6,6-tetramethyl-3,5-heptanedionato) aluminum, tris(2,2,6,6-tetramethyl-3,5-heptanedionato) bismuth, tris(2,2,6,6-tetramethyl-3,5-heptanedionato) lanthanide (for example, $(M(TMHD))_3$ wherein M=La, Pr, Nd, Sm, Eu, Gd, Tb, Dy, Ho, Er, Tm, Yb, Lu), metal cyclopentadienyls and their derivatives (for example, $M(R_nCp)_2$ wherein R=Me, Et, $^iPr$, $^tBu$, $^nPr$, $^nBu$; n=0, 1, 2, 3, 4, 5; M=Co, Fe, Ni, Mn, Mg, Ru, Cr, Sr, Ba; $M(RCp)_3$ wherein R=methyl (Me), ethyl (Et), isopropyl ($Pr^i$), tert-butyl ($Bu^t$), n-butyl, sec-butyl; n=0, 1, 2, 3, 4, 5; M=La, Pr, Nd, Sm, Eu, Gd, Tb, Dy, Ho, Er, Tm, Yb, Lu), metal pyrrolyls (py) (for example, $Sr(t-Bu_2py)_2$, $Ba(t-Bu_2py)_2$), metal imidazolyl (for example, distrontium tetra(2,4,5-tri-tert-butylimidazolate), dibarium tetra(2,4,5-tri-tert-butyl-imidazolate)), metal β-ketoiminates (for example, bis(2,2-dimethyl-5-(dimethylaminoethyl-imino)-3-hexanonato-N, O,N')strontium, bis(2,2-dimethyl-5-(1-dimethylamino-2-propylimino)-3-hexanonato-N,O,N')strontium, bis(2,2- dimethyl-5-(1-dimethylamino-2-propylimino)-3-hexanonato-N,O,N')nickel, bis(2,2-dimethyl-5-(1-dimethylamino-2-propylimino)-3-hexanonato-N,O,N') cobalt), organometallic compounds having both cyclopentadienyl and carbonyl ligands (for example CpMn(CO)$_3$, MeCpMn(CO)$_3$) compounds having both alkenyl and carbonyl ligands (for example, cycloheptatriene molybdenum tricarbonyl, cycloheptatriene tungsten tricarbonyl), decaborane, boron, magnesium, gallium, indium, antimony, copper, phosphorous, arsenic, lithium, sodium tetrafluoroborates, inorganic precursors incorporating alkyl-amidinate ligands, precursors such as zirconium tertiary butoxide (Zr(OBu$^t$)$_4$), tetrakisdiethylaminozirconium (Zr(NEt$_2$)$_4$), tetrakisdiethylaminohafnium (Hf(NEt$_2$)$_4$), tetrakis (dimethylamino) titanium (TDMAT), tert-butyliminotris (deithylamino) tantalum (TBTDET), pentakis (dimethylamino) tantalum (PDMAT), pentakis (ethylmethylamino) tantalum (PEMAT), hexakis (dimethylamino) tungsten, tetrakisdimethylaminozirconium (Zr(NMe$_2$)$_4$), tungsten hexachloride (WCl$_6$), hafniumtertiarybutoxide (Hf(OBu$^t$)$_4$), and mixtures thereof.

In one embodiment, the base, the sidewall, and/or the interior surface of the lid of the vessel may have at least one protrusion, which extends into the interior volume and contacts the precursor material. The at least one protrusion may aid in transferring the heat directly into the precursor material. In another embodiment, with or without the addition of heat, an inert carrier gas, such as, for example, nitrogen, hydrogen, helium, argon, or other gas, is flowed through the interior volume and combines with the gaseous phase of the precursor material to provide a precursor-containing gaseous stream. In another embodiment, a vacuum may be used, alone or in conjunction with the inert gas and/or heating, to withdraw the precursor-containing gaseous stream from the vessel. The precursor-containing gaseous stream may be then delivered to downstream production equipment, such as, for example, a reaction chamber for deposition. The vessel may provide for a continuous flow of precursor-containing gaseous stream while avoiding "cold spots" or other problems attributable to the condensation of vapors contained therein. The vessel may also provide a consistent and reproducible flow rate, which may be advantageous for a variety of manufacturing processes.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

The term "conduit," as used in the specification and claims, refers to one or more structures through which fluids can be transported between two or more components of a system. For example, conduits can include pipes, ducts, passageways, and combinations thereof that transport one or more fluids such as liquids, vapors, and/or gases.

The term "fluid", as used in the specification and claims, refers to a substance comprised of one or more components, which can be gas, liquid, vapor, sublimed solid, or combinations thereof, which is capable of flowing.

The term "fluid communication," as used in the specification and claims, refers to the nature of connectivity between two or more components that enables a fluid or liquids, vapors, sublimed solids, and/or gases to be transported between the components in a controlled fashion (i.e., without leakage). Coupling two or more components such that they are in fluid communication with each other can involve any suitable method known in the art, such as with the use of welds, flanged conduits, gaskets, adhesive, and bolts.

The invention will be described with reference to the drawings showing specific embodiments of the invention; however, it is understood that other embodiments, for example vessels having more than one inlet and/or more than one outlet and/or more than one particle barrier may be used in this invention. In order to aid in describing the invention, directional terms may be used in the specification and claims to describe portions of the present invention (e.g., upper, lower, left, right, etc.). These directional terms are merely intended to assist in describing and claiming the invention, and are not intended to limit the invention in any way. In addition, reference numerals that are introduced in the specification in association with a drawing figure may be repeated in one or more subsequent figures without additional description in the specification in order to provide context for other features. Additionally "more than one" is equivalent to "at least one" and are used interchangeably herein.

Figure 1:
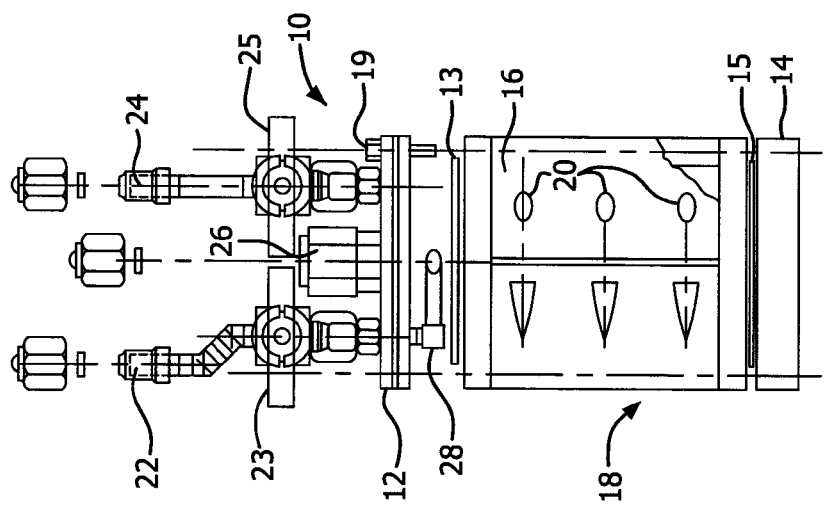
FIG. 1 is an exploded side view of a prior art vessel disclosed herein.

FIGS. 1 and 2 provide an exploded side view and cross-sectional view, respectively, of prior art vessels wherein the at least one protrusion extends from the base of the vessel. These embodiments and others are disclosed in US 2008/0092816. US 2008/0092816 is fully incorporated herein by reference. Aspects of the vessels disclosed in US 2008/0092816 that are useful in the vessels and method of the present invention are included in the present invention by its incorporation herein. In FIGS. 1 and 2, the vessel is a vessel 10 having a lid 12 for a top, a base 14, sidewall(s) 16, and a pair of seals 13 and 15 located near lid 12 and base 14, respectively. While vessel 10 is shown as being substantially cylindrical in shape, it is understood that vessel may be shaped, for example, as a hollow square or rectangular tube. Note that the terms sidewall, sidewall(s) or sidewalls may be used to describe the one or more sidewalls of the vessel and includes embodiments having a single contiguous sidewall or multiple sidewalls that are welded or otherwise fused together. Seals 13 and 15 which may be a seal, o-ring, gasket, insert or the like may be used to allow vessel 10 to maintain a vacuum or sustained pressure and may be constructed of a metal or a polymeric material. Alternatively, lid 12 and/or base 14 may be aligned onto sidewall 16 to form an airtight or pressure-tight seal without the need for one or both of seals 13 and 15. Lid 12 may be removable or not removable from the rest of the vessel. Lid 12 may be fastened onto the sidewall 16 through the one or more fasteners (attachment means) 19 such as a screw, fastener or pin as shown in FIG. 1. In an alternative embodiment, lid 12 may be fastened onto sidewall 16 through grooves that correspond to complementary recesses that align and allow lid 12 to be fastened onto sidewall 16 (not shown). In still further embodiments, lid 12 may be fastened onto sidewall 16 through welding, bonding, adhesives, or other means. Alignment pins (not shown) may be used to ensure proper alignment and fit between the lid and the sidewall and/or the sidewall and base for embodiments where the base is removable.

Lid 12, base 14, and sidewalls 16 define an interior volume 17 to contain the precursor material. Lid 12, base 14, and sidewalls 16 may be constructed of a metal or other material that can withstand the operating temperatures of vessel 10. In certain embodiments, at least a portion of lid 12, base 14, and sidewalls 16 may be chemically non-reactive to the precursor material contained therein. In these or in alternative embodiments, at least a portion of lid 12, base 14, and sidewalls 16 may be thermally conductive. Exemplary metals for lid 12, base 14, and sidewalls 16 include stainless steel, titanium, chrome, zirconium, monel, impervious graphite, molybdenum, cobalt, anodized aluminum, aluminum alloys, silver, silver alloys, copper, copper alloys, lead, nickel clad steel, graphite, a ceramic material, doped or undoped, or combinations thereof. In one embodiment, at least a portion of the surface that contacts the precursor may be plated with various metals such as titanium, chrome, silver, tantalum, gold, platinum, titanium and other materials wherein the aforementioned plating materials can be doped or undoped to increase surface compatibility. In these embodiments, the plating material may be non-reactive to the precursor material contained therein.

Lid 12 may contain a fluid inlet 22 for the flow of an inert carrier gas or mixture thereof and a fluid outlet 24 for the flow of the precursor-containing fluid stream. Exemplary inert carrier gases that may be introduced into vessel 10 through inlet 22 include, but are not limited to, hydrogen, helium, neon, nitrogen, argon, xenon, krypton, or mixtures thereof. The precursor is typically located in the lower interior volume, sometimes located on or just above the inside surface of the base. In some embodiments the precursor may be located on a tray. In some embodiments the precursor is located on a screen or frit. In some embodiments the precursor is not located on a screen or frit and may be in contact with the inside surface of the base. In most embodiments, although not limited to such, the carrier gas with fluidized precursor, preferably vaporized, ascends from the lower interior volume of the vessel to the outlet often located in or through the lid. The carrier gas may flow out of the inlet (the inlet may penetrate or go through the lid) whereby the carrier gas is introduced above the precursor in the vessel. In an alternative embodiment, the flow of carrier gas may be reversed. In certain embodiments, the precursor-containing fluid stream is withdrawn from vessel 10 without the aid of a carrier gas but rather a vacuum, pressure differential, or other means. In these embodiments, inlet 22 and any valves or structures associated therewith may be optional. Lid 12 is also depicted having a fill port 26 for introducing the precursor material (not shown) into interior volume 17. In alternative embodiments, precursor material can be introduced into interior volume 17 through inlet 22, base 14 (particularly in those embodiments where base 14 is removable) or other means besides fill port 26. In some embodiments, the fill port may be used as a level sensing port. In these embodiments, the port may contain, for example, a window, sensor, probe, and/or other means to detect the presence of precursor within the vessel.

In some embodiments, such as that depicted in FIGS. 1 and 2, inlet 22 and outlet 24 may include valves 23 and 25 that act to control the flow of fluid into and out of vessel 10. Valves 23 and 25 may be manual, automatic such as pneumatic, or the like and preferably are capable of operating at the operating temperatures of the vessel. In certain embodiments, valves 23 and 25 may be fitted with disconnect fittings to facilitate removal of vessel 10 from the process line. Brackets (not shown) to minimize the bending of the inlet 22 and outlet 24 tubing may support valves 23 and 25. Further, the inlet and outlet tubing may be connected with a standard gas tight fitting, such as a VCR™ fitting manufactured by the Swagelok Company of Cleveland, Ohio, that is used to connect two separate pieces of piping. In some embodiments, the outlet 24 may have one or more filters 30 and 32 that are placed in-line on the outlet tubing to remove any impurities or particulate matter from the precursor-containing fluid stream. Filters 30 and 32 may be comprised of a porous material (not shown) that is chemically unreactive to the precursor-containing fluid stream and has a sufficiently small pore size and related ability to capture (that is not let them pass through the filter) particles above a certain size to capture all or most of the impurities or particulate matter above that particle size (for which the filter is rated) that are in the precursor-containing fluid stream as it passes therethrough.

In some embodiments such as that shown in FIGS. 1 and 2, inlet 22 may further have a vortex-generating inlet 28 that directs the flow of the inert gas downward into the interior volume 17 and optionally along the internal surface of sidewall 16. While vortex generating inlet is depicted in FIGS. 1 and 2 as a tube that extends tangentially into interior volume 17 and resembles a "L", it is envisioned that other configurations such as, for example, a fin extending from sidewall 16, a "J" shaped tube, or a "T" shaped tube may also direct the laminar flow of the inert carrier gas. In the latter embodiment, the "T" shaped tube may be angled on one or both ends and/or may be oversized. In certain embodiments, outlet 24 may also have a tube that extends into interior volume 17 that has a "T" shaped tube or other configuration. In these embodiments, the "T" shaped tube on outlet 24 may be used in addition to, or in lieu of, the "T" shaped tube on the fluid inlet. The "T" shaped orifice has two openings to receive the carrier gas and/or the precursor product to be dispensed. The openings have a slanted configuration that allows the outlet to be placed very closely to the inner circumferential surface of the lid and/or sidewall and the arc of either or both of their curvatures.

In alternative embodiments of the invention, the vessel may further comprise any number of valves (which may be manual or automatically controlled) on the exterior of the lid for the inlet and the outlet and may also comprise one or more purge lines having one or more separate valves between the inlet and outlet. One preferred embodiment is any of the 5-valve arrangements shown in U.S. Pat. Nos. 7,568,495, 7,832,432, 7,748,400, 7,562,672, 5,069,244, 2010/0269937 and JP 2614338 and JP 2000/0269937, all incorporated herein by reference.

In the embodiment shown in FIGS. 1 and 2, vessel 10 further comprises a thermally conductive jacket 18 that surrounds at least a portion of vessel 10. Thermally conductive jacket may allow for the uniform distribution of heat and improve the conduction of heat into the precursor material contained within the interior volume 17 of vessel 10. Thermally conductive jacket may be secured around vessel 10 via fasteners and/or a different material that allows for the expansion of the jacket upon heating. For example, thermally conductive jacket 18 may be comprised of aluminum whereas the sidewall 16 of vessel 10 may be comprised of stainless steel 16. Thermally conductive jacket 18 may be secured around sidewall 16 using springs to account for thermal expansion upon heating the vessel and precursor material contained therein.

Vessel 10 and the precursor material contained therein may be heated to the temperature at which the material is in its gaseous phase, or sublimation temperature when the precursor is a solid material, through a variety of means that include, but are not limited to, strip heaters, radiant heaters, circulating fluid heaters, resistant heating systems, inductive heating systems, or other means that can be used alone or in combination. These heating sources may be external and/or internal in relation to vessel 10. In some embodiments, the entire vessel 10 may be introduced into an oven. In other embodiments, base 14 may have one or more heating elements of cartridges contained therein. Other embodiments may employ one or more inductive heating coils operated by an RF power supply. Yet other embodiments may employ a heater that is in fluid communication with the carrier gas supply that heats the carrier gas to a certain temperature prior to introduction into vessel 10.

Vessel 10 may further have one or more thermocouples, thermistors, or other temperature sensitive devices that can monitor the temperature of vessel 10 and the precursor material contained therein. The one or more thermocouples may be located in the base, lid, interior volume and/or other areas of the vessel. The one or more thermocouples or other temperature sensitive devices may be connected to a controller or computer that is in electrical communication with the heating source to maintain a uniform temperature within the interior volume of the vessel and the chemical contained therein.

Vessel 10 may further have one or more protrusions 34 that extend into the interior volume 17. FIGS. 1 and 2, provide an illustration of an embodiment wherein a plurality of "spike-shaped" protrusions 34 is employed. Protrusions 34 may be comprised of a thermally conductive material or a composite thereof. In some embodiments such as that illustrated in FIG. 2, protrusions 34 may be comprised of a thermally conductive core such as copper 34a and a non-reactive surface such as stainless steel 34b that contacts the precursor material. The base 14 may be removable from sidewall 16 to allow for ease of cleaning and servicing. While protrusions 34 extend from base 14 in the Figures, it is envisioned that protrusions 34 may also extend into interior volume 17 from the sidewall 16, lid 12, base 14, or combinations thereof. Protrusions 34 contact the precursor material contained therein to improve heat transfer. Protrusions 34 are arranged to allow for the unimpeded flow of gas between and amongst the protrusions and the precursor material contained therein. Further, protrusions 34 may also keep the precursor material from agglomerating, if desired.

Other configurations (not shown herein) include a "clover-leaf" configured protrusion that may extend from base 14. The cloverleaf configured protrusion may divide interior volume into separate, but interconnected, areas that allow the unimpeded flow of carrier gas within the volume. Alternative embodiments that are not shown include at least one "fin-shaped" protrusion extending from the sidewall and/or the base and/or the lid of vessel into interior volume 17. The fin-shaped protrusions may be substantially perpendicular to fluid inlet and fluid outlet.

Figure 3A:
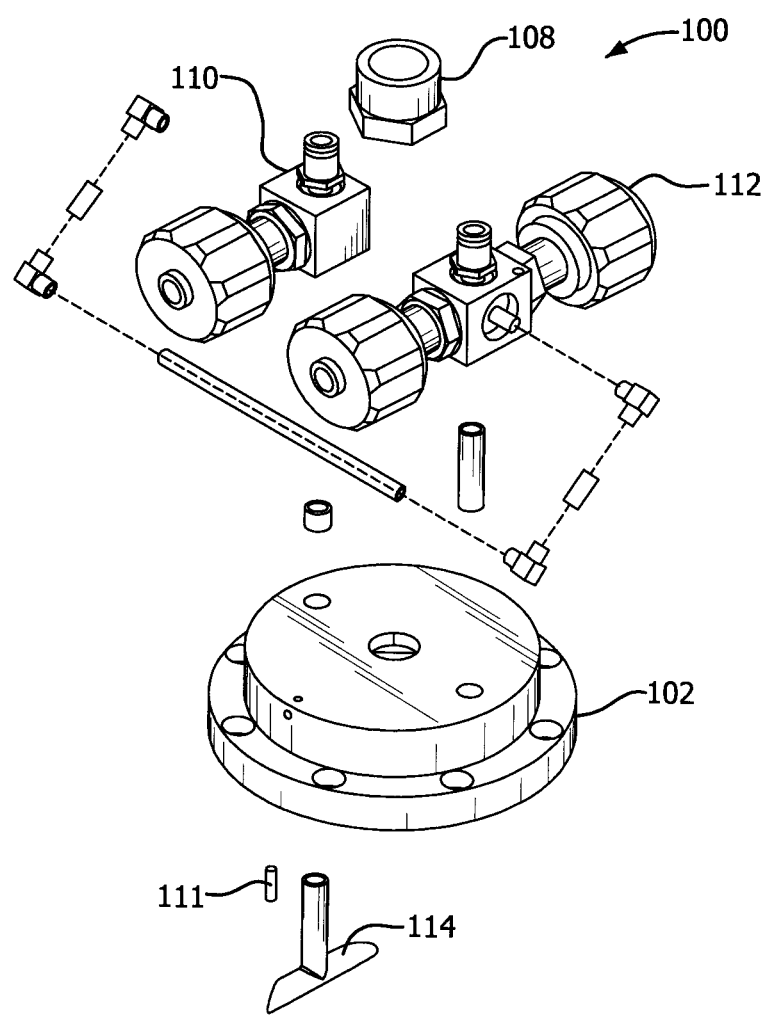
FIG. 3a is an exploded, isometric view of a prior art lid of a vessel.
Figure 3B:
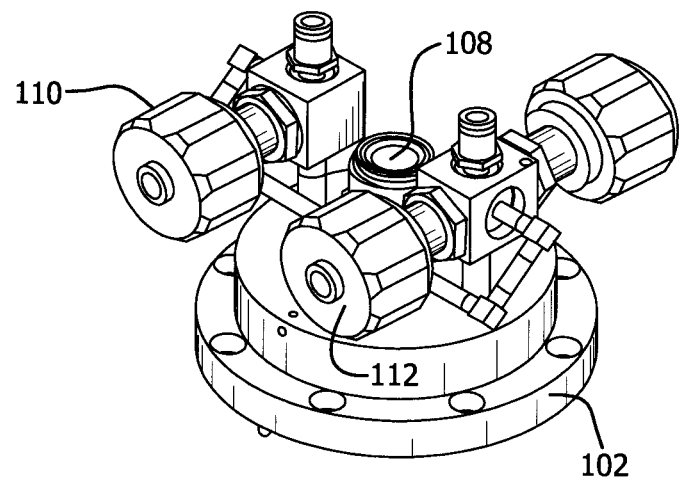
Figure 3C:
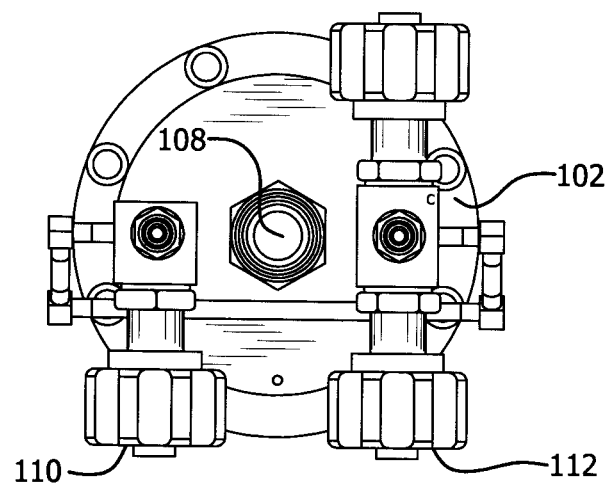

FIG. 3a through 3c provide various detailed views of a lid 102 that may be used on the vessel of this invention. As shown in FIGS. 3a and 3b, the fluid inlet comprises a "T" shaped tube 114 that aids in the flow of incoming carrier gas through fluid inlet 110 into the interior volume of vessel (not shown). In these embodiments, "T" shaped tube 114 may reduce the laminar flow of the incoming carrier gas thereby minimizing the possibility of carrying unsublimated precursor in the outgoing precursor-containing fluid stream. Lid 102 may further employ one or more alignment pins 111 to aid in the proper fitting and alignment of lid 102 to sidewall (not shown). Fluid outlet 112 comprising a plurality of valves is shown. Fill port 108 is also shown.

The vessel may further comprise a window (not shown in the figures) that is positioned to determine the contents within the interior volume. Suitable materials for the window include transparent materials that have a sufficient thermal conductivity to minimize condensation and deposition of vapors on the window including, for example, diamond, sapphire, silicon carbide, transparent ceramic materials, and the like.

Operating temperatures of the vessel may vary depending upon the precursor material contained therein but may generally range from about 25° C. to about 500° C., or from about 100° C. to about 300° C.

Operating gas pressure of the vessel may range from about $10^{-2}$ torr to about 1,000 torr, or from about 0.1 torr to about 200 torr.

Depending upon the precursor and/or the process conditions, there may be a need to stop the entrainment of solid and/or liquid particulate in the outgoing precursor-containing fluid stream. The prior art embodiments with filters located in the inlet and outlet and elsewhere were too small, frequently clogged, and caused high pressure drops and/or high gas velocities. For these embodiments, vessels may comprise one or more particle barriers of this invention. The at least one particle barrier comprising at least one filter reduces or prevents solid or liquid (unsublimated or unvaporized) precursor particles from being entrained in the (outgoing) precursor-containing fluid stream exiting the vessel through the at least one outlet. In other embodiments, the at least one particle barriers are located on the at least one inlet and prevent precursor particles from entering the at least one inlet. The one or more particle barriers comprising the one or more filters are located in the interior of the vessel. The interior of the vessel is defined by one or more sidewalls and the top and bottom walls. The bottom wall may be referred to as a base. The top wall may be a lid, which may or may not be removable from the sidewalls. FIG. 4 through 9 show particular embodiments of this invention. Any description of the vessels and elements of the vessels described above are applicable and are or may be included in the invention, although not repeated below. Additionally, aspects of vessels known to persons of ordinary skill in the art may be incorporated into the vessels and methods of this invention although not described herein.

The term filter is used to mean a material that allows gas to pass therethrough but restricts the passage of particles that are entrained in the gas based on the size of the particles. The material of the filters can comprise any of a variety of different materials, such as high flow sintered nickel fiber media, or other metals (e.g., stainless steel), ceramics (e.g., alumina), quartz, or other materials typically incorporated in gas or liquid filters. Commercially available sintered metal filters, including but not limited to 316L, 304L, 310, 347, and 430 stainless steel; Hastelloy C-276, C-22, X, N, B and B2; Inconel 600, 625 and 690; Nickel 200 and Monel® 400 (70 Ni-30 Cu); titanium; alloy 20; and others, all of which are designed for highly corrosive chemistry service. It is important that the one or more filters used in the particle barriers in this invention be selected such that they have (mean) pore sizes and/or particle capture efficiencies that are useful for preventing substantially all (or most) of the particles of a certain size and larger particles from passing through the filter(s). Useful mean pore sizes and capture efficiencies will be disclosed below. Since the filter is exposed to the precursor, the preferred filters are those that are inexpensive enough to be changed out and replaced with a new filter each time the vessel is cleaned and filled with fresh precursor.

Figure 4:
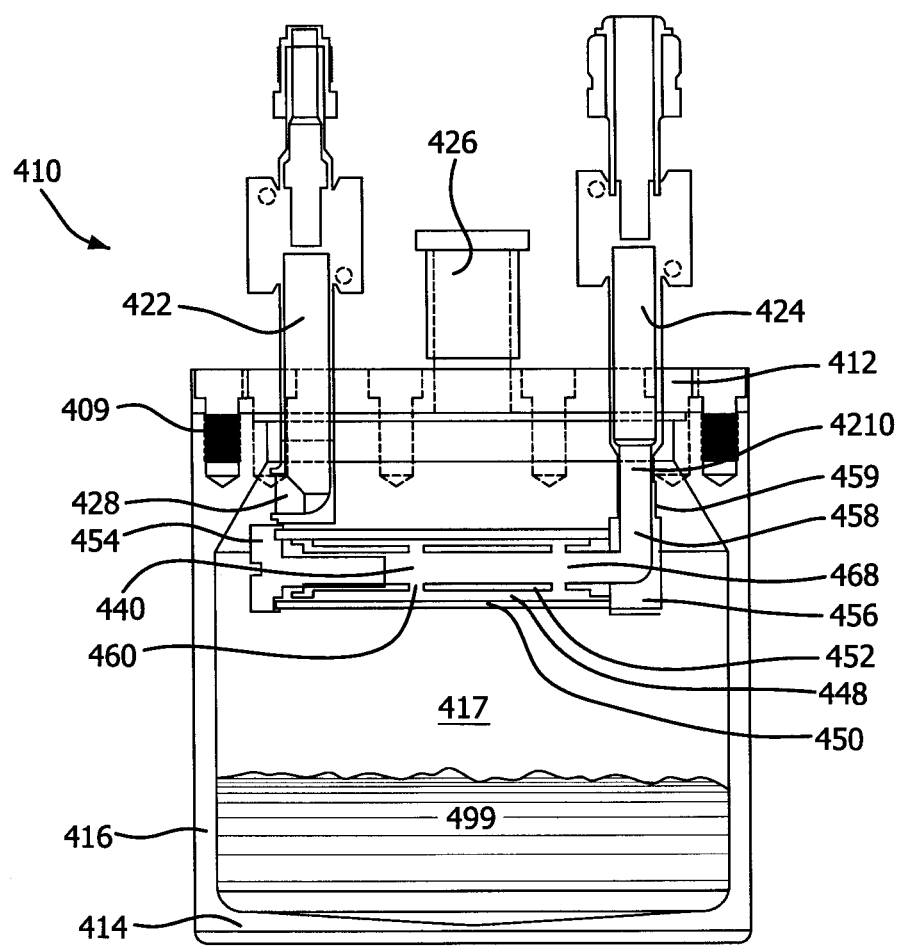
FIG. 4 is a cross-sectional side view of a vessel of the invention showing a particle barrier therein.

FIG. 4 shows a vessel 410 comprising a particle barrier 440 therein. The vessel comprises a fluid inlet 422 (optional) and fluid outlet 424, and a fill port 426 (optional) that pass through lid 412 and are in fluid communication with the interior volume 417. The inlet, outlet and fill port are located on and pass through the lid for convenience; however, one or more of those elements could be located on or through the sidewall(s) or the base. The vessel 410 further comprises sidewall 416, and base 414, which in this embodiment is integral to the sidewall 416. The lid 412, sidewall 416 and base 414 define an interior volume 417. The lid 412 is shown as being attached to the sidewalls 416 via mechanical attachment equipment 409 (fasteners (screws) 409 are shown, nuts and bolts and/or others may be used); however, alternatively the lid may be integral with the sidewall(s) which may be integral with the base. That is, the vessel comprising the lid, sidewall(s) and/or the base may be formed (for example, cast or machined) as a single piece or welded to become a single piece. It is understood that any reference to a vessel comprising lid, base and/or sidewall(s) includes any combination of integral lid, base and/or sidewall(s) and/or a mechanically attached lid, base and/or sidewall(s). Further although the sidewall is (as shown) a cylinder having a circular horizontal cross-section, the vessel could comprise more than one sidewall providing a horizontal cross-section having 3 or more sides, for example, a rectangle, pentagon or hexagon or it could be an oval or any shape comprising one continuous sidewall or multiple straight or curved sidewalls attached to each other and forming an angle between.

Solid or liquid precursor 499 is shown in the interior volume 417. Attached to the inlet 422 is an inlet elbow 428; however, as described earlier the inlet may comprise a "L", "T", or "J" or other extension or connection or no connection or no extension can be used to direct the flow of the carrier gas into the interior volume. The inlet elbow 428 causes intimate mixing of the carrier gas and the precursor material and the evolving precursor transitioning into the vapor phase. Additionally or alternatively, the vessel may further comprise a particle barrier in fluid communication with the inlet which will be described below with reference to FIG. 6.

In some embodiments of this invention, the vessel does not comprise a fluid inlet for a carrier gas. For example, such embodiments include vessels from which a solid becomes a vapor without the requirement of a carrier gas, for example, vessels into which heat is added and/or the pressure is decreased to cause sublimation of the solid and/or evaporation of the liquid that is inside the vessel.

Figure 5:
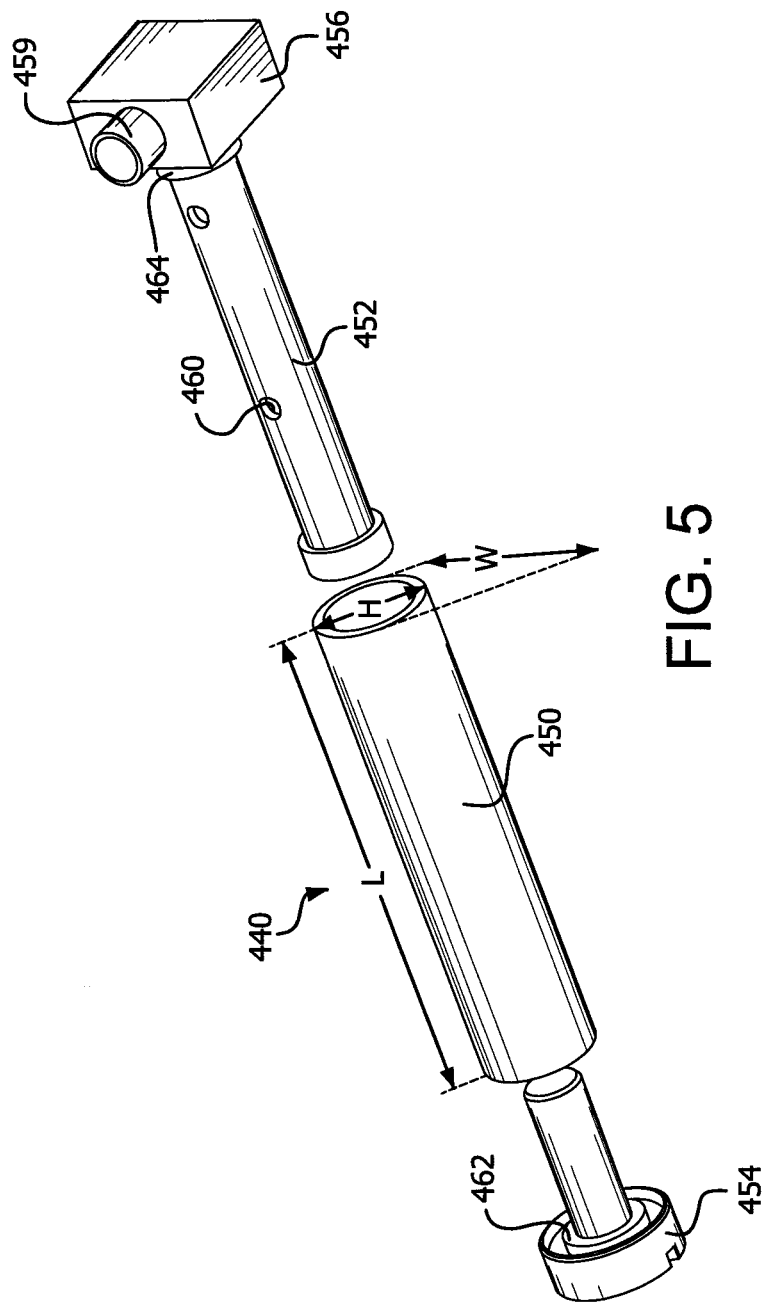
FIG. 5 is an exploded perspective view of the particle barrier shown in FIG. 4.

In one embodiment, the particle barrier 440 as shown in FIG. 4, and exploded in FIG. 5, comprises a filter 450, shown as a tubular filter, and one or more support elements. The support elements, in the embodiment shown in FIG. 5 comprise a mounting block 456 with attached cylindrical tube 452, and fastener (e.g. screw) 454 which is removably attached to the cylindrical tube 452. (Note the use of the term mounting block is not meant to limit its shape. It can have any shape.) The mounting block has a passage connector 459 which as shown in FIG. 4 can be attached to the outlet 424 via passage 4210. (Passage 4210 is an extension of and therefore part of the outlet 424 extending into the interior volume 417. Alternative embodiments do not require an extension of the outlet 424 into the interior volume 417. In those embodiments the particle barrier may be attached, for example, directly to the lid or directly to outlet 424 where outlet 424 penetrates the lid 412.)

Through the mounting block 456 is a mounting block passage 458 that is shown in FIG. 4 that is in fluid communication with the passage 4210 through passage connector 459 and the passage 468 that is the annular space defined by the cylindrical tube 452. The filter 450 is slid over the cylindrical tube 452 and held in place with a fastener (e.g. screw) 454. Alternative mechanical attachment equipment, such as bolts or welds can be used instead of the fastener (e.g. screw) 454. Optional rims 462 and 464 machined into the fastener (e.g. screw) 454 and mounting block 456 respectively are used to position the filter 450. The mounting block 456 has a passage 458 through the mounting block 456 that is in fluid communication between passage 4210 (part of the outlet 424), and with the interior passage 468 of cylindrical tube 452. When the precursor-containing fluid stream comprising a gaseous phase of a precursor from the vessel passes through the filter 450 from the interior volume 417 of the vessel 410, it enters space 448 defined between the filter 450 and the exterior surface of the cylindrical tube 452. (In this embodiment, the particle restricted space is partially defined by parts of the support elements of the particle barrier, that is, part of the fastener (e.g. screw) 454 and mounting block 456. The balance of the particle restricted space is defined by the filter.) Cylindrical tube 452 comprises openings 460 through the cylindrical tube 452 that are in fluid communication with and allow for the fluid to travel into the interior passage 468 of the cylindrical tube 452. From there the fluid travels through the passage 458 in the mounting block 456, through the passage 4210 which is an extension of the outlet 424.

The particle barriers of this invention define or at least partially define a particle restricted space within the interior volume of the vessel. In embodiments for which the particle barriers only partially define a particle restricted space within the interior volume, the remainder of the particle restricted space may be defined by the inlet, outlet, lid, sidewall(s) or base or other structures within the vessel. The particle restricted space is in fluid communication with the outlet (or in alternative embodiments the inlet and/or in alternative embodiments there are at least two particle restricted spaces, one in fluid communication with the outlet and one in fluid communication with the inlet) and in particle restricted fluid communication with the remainder of the interior volume. As shown in FIG. 4, the particle restricted space comprises the internal space defined by the particle barrier, that is, the sum of space 448, openings 460, annular passage 468, the mounting block passage 458 and the interior of the connector 459. Although located in the interior volume 417, due to the presence of the filter that is part of the particle barrier, the particle restricted space is in particle restricted fluid communication with the interior volume 417, meaning that most, if not all, of the particles above the size for which the filter is rated that may be present in the interior volume outside of the particle restricted space (which is at least partially defined by the filter) will not be present within the particle restricted space. The precursor containing fluid stream generated in interior volume 417 will pass through the filter, but the particles (above a certain size) if present in the precursor containing fluid stream, will not pass through the filter with the fluid stream. The precursor-containing fluid stream that enters the particle restricted space and exits the vessel via outlet 424 will not therefore contaminate downstream processes with the presence of particles in that fluid.

One of the additional benefits of the design of the particle barrier shown in FIGS. 4 and 5 is that the tubular filter 450 that is in the shape of a sleeve can easily be removed and replaced by unfastening (e.g. unscrewing) the fastener (e.g. screw) 454 and sliding the filter off the cylindrical tube 452. Carefully machined mating surfaces on the filter 450 and the fastener (e.g. screw) 454 and the mounting block 456 provide sealed connections in the particle barrier 440 when assembled and do not allow particles (and preferably the fluid stream) to by-pass the filter and exit the vessel with the precursor-containing fluid stream. In these or other embodiments, gasket, o-rings, seals or other means may be further used to minimize entry of particles into the particle restricted space.

An extension of outlet 424 (passage 4210) penetrates the lid 412 and is connected to and/or in fluid communication with the particle barrier 440. Particle barrier 440 has an overall tubular shape. Particle barrier 440 comprises tubular filter 450. As shown in FIG. 4 particle barrier 440 is mounted so that its overall tubular shape (that is the length L of the tubular filter as shown in FIG. 5) is parallel to the lid; however, it could have been mounted, so that the length L as shown in FIG. 5 (that is the central axis of the tube) of the tubular filter was perpendicular or at any angle to the lid. (Altering the orientation of the passage through the mounting block and the connector 459 may be desirable if the particle barrier is mounted in a different orientation. In this embodiment, it is preferred that the particle barrier is mounted in the interior volume so that the filter is not submerged in, nor contacting the precursor when the precursor is properly introduced into the vessel (not overfilled) and is in its expected resting position in the lower interior volume of the vessel prior to use.

The particle barrier may comprise one or more 2- or 3-dimensional filters. The particle barrier may comprise one or more than one 3-dimensional filter. The particle barrier may comprise more than one 2-dimensional filters or the particle barrier may comprise at least one 2-dimensional filter and at least one 3-dimensional filters. As shown in FIG. 5, tubular filter 450 has 3-dimensions, a length L, width W and height H, as compared to a flat disk filter, a flat rectangular filter or a flat filter of alternate shape that has only a length and a width with the height of the filter being equal to or substantially equal to the thickness of the filter material. A flat disk or other 2-dimensionally shaped filter may be used to form a 3-dimensional filter by bending or twisting it or by attaching at least two or multiple flat filters, that is 2-dimensional filters, on angles to each other or via separate supports to form the equivalent to a three-dimensional filter which is useful as a 3-dimensional filter (or an equivalent 3-dimensional filter) that can be used in, as at least part of, the one or more particle barriers useful in the vessels of this invention. A 3-dimensional filter or equivalent 3-dimensional filter of this invention has a length, width and height (and/or a diameter and length) that are each greater than the thickness of the filter material. The term 3-dimensional filter may be a filter that comprises at least one 3-dimensional filter or a filter that comprises more than one filter (e.g. 2-dimensional filters) that are attached to each other in such a way as to make (the equivalent of) a 3-dimensional filter.

Figure 6:
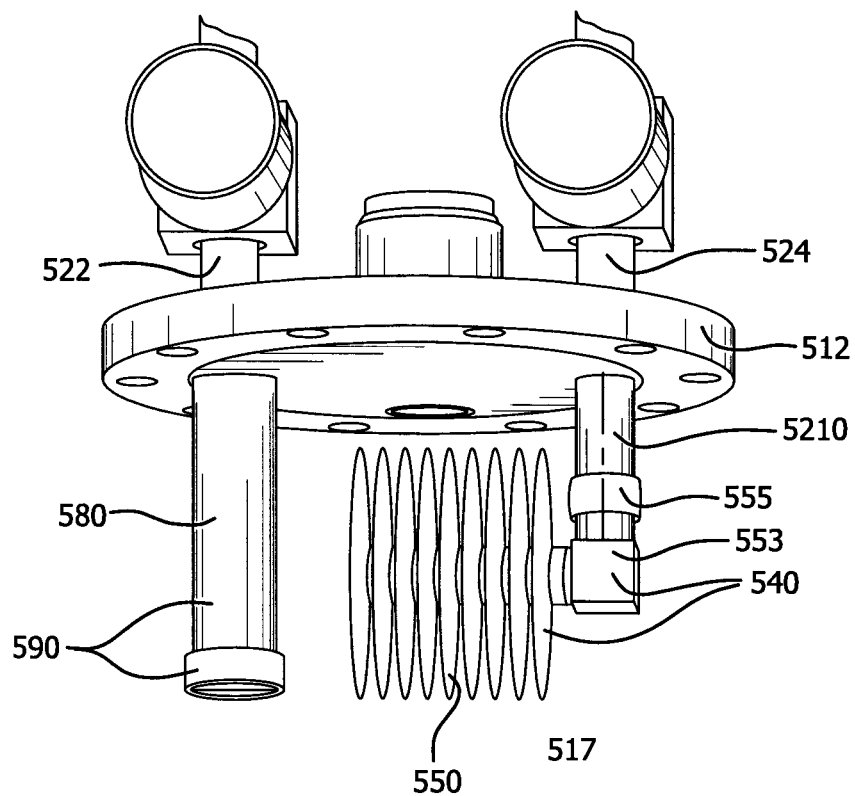
FIG. 6 is a perspective view of a lid of a vessel having a bellow-shaped particle barrier attached thereto.

An alternative embodiment of the invention is shown in FIG. 6. FIG. 6 shows only a portion of the vessel, the rest is as shown and described earlier in reference to the other figures. The particle barrier 540 comprises a filter 550 that has a bellows shape as shown. The bellows-shaped filter (also sometimes referred to as a pleated-shaped filter) provides increased filter surface area. The filter is 3-dimensional and defines an internal volume therein. As shown, the particle barrier 540 further comprises a support element, a tube elbow 553 attached to the bellow-shaped filter 550. Tube elbow 553 is in fluid communication (via a passage that is not shown through the tube elbow) with outlet 524 via passage 5210 which is an extension of outlet 524 through the lid 512 into the interior volume 517. The particle barrier 550 can be attached to passage 5210 via an optional mechanical fitting 555. Mechanical fitting 555 can be a compression, faceseal or other standard gas tight fitting, for example, a VCR™ fitting manufactured by the Swagelok Company of Cleveland, Ohio, that is used to connect two separate pieces of piping. Alternatively the particle barrier 550 can be welded directly to the passage 5210 of outlet 524. Not shown in FIG. 6, is the internal volume inside the bellow-shaped filter 550 that is part of the particle restricted space of particle barrier 550. Fluid from the internal volume 517 of the vessel passes through filter 550 into the internal volume (not shown) of the bellow-shaped filter 550 in fluid communication with elbow 553, then through the mechanical fitting 555 and through passage 5210, and the rest of outlet 524. The particle barrier 540 comprising filter 550 and support element 553 comprises a particle restricted space that comprises the internal volumes of the filter 550 and support element 553.

Also shown in the embodiment shown in FIG. 6 is a separate particle barrier 590 in fluid communication with inlet 522, as shown, comprising a tubular filter 580. Aspects of the particle barrier 590 and tubular filter 580 in fluid communication with inlet 522 shown in FIG. 6 are similar to those shown and described above with reference to FIGS. 4 and 5 except that the orientation shown in FIG. 6 is perpendicular to the lid, that is that the length L along the axis of the tubular filter 580 is perpendicular to the lid, and in this embodiment, the particle barrier defines a particle restricted space in fluid communication with the inlet 522.

Figure 9:
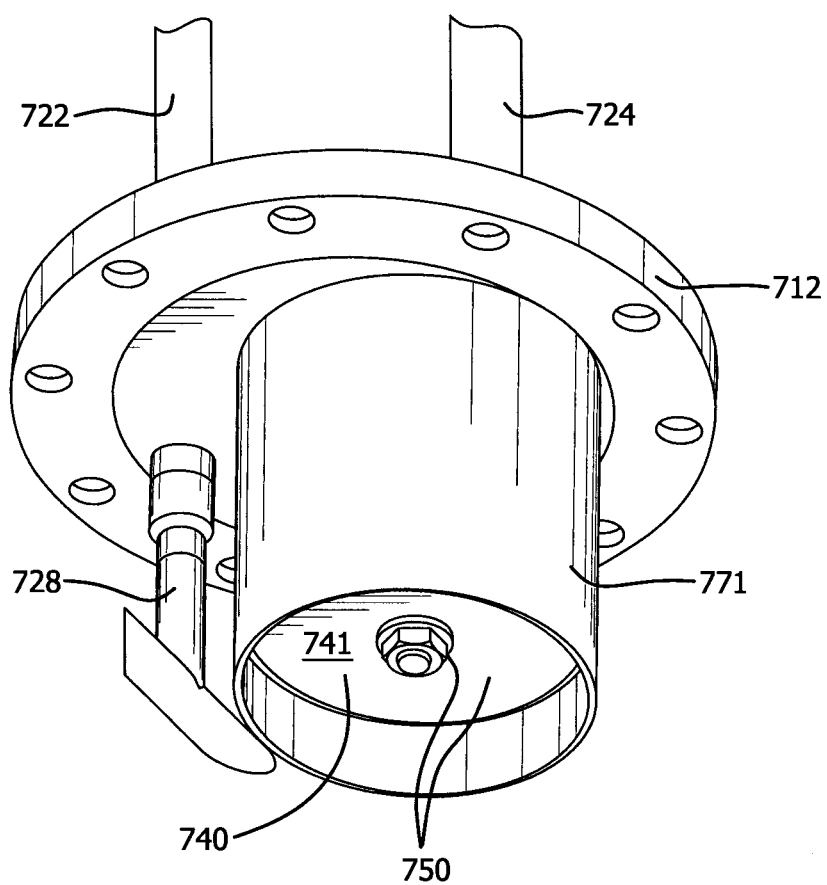
FIG. 9 is a perspective view of a lid of vessel having a "T" shaped inlet tube extension and a cup-shaped particle barrier attached thereto having a flow shield around the cup-shaped filter.

In an alternative embodiment, not shown in FIG. 6, the vessel may comprise one or more flow barriers between the particle barrier 550 and the inlet filter 580 (particle barrier 590) that is impervious to the carrier gas that exits the inlet filter 580 directly towards the particle barrier 550. The flow barrier would prevent the carrier gas exiting the inlet filter 580 from directly entering (passing through) the particle barrier 540 in communication with the outlet 524 and exiting the vessel. The desired path of the carrier gas is from the inlet, typically located in the upper interior volume down towards the lower interior volume where the precursor is typically located. A flow barrier is shown in FIG. 9 and will be described below.

By passing the carrier gas through the filter 580 of particle barrier 590, entraining the precursor and passing through the filter 550 of particle barrier 540 before dispensing assures that solid precursor particles (having a particle size greater than the filter is rated to capture) do not enter the outlet 524 with the desired precursor-containing fluid stream, and the inlet does not face potential contamination with the solid precursor particles in a backflow situation. When the carrier gas is saturated with precursor, this embodiment prevents entrainment of particles or solids from any source (e.g., from the carrier gas, the inlet, from the vessel, the precursor contained within the vessel, or combinations thereof).

This embodiment shown in FIG. 6, comprising particle barriers on the at least one inlet and the at least one outlet, also allows the vessel to be placed in different orientations from upright during transport and handling without having a detrimental effect on particle generation or plugging of the at least one inlet or at least one outlet. It is understood that different shaped particle barriers may be used on the at least one inlet and/or at least one outlet other than those shown in FIG. 6.

Figure 7:
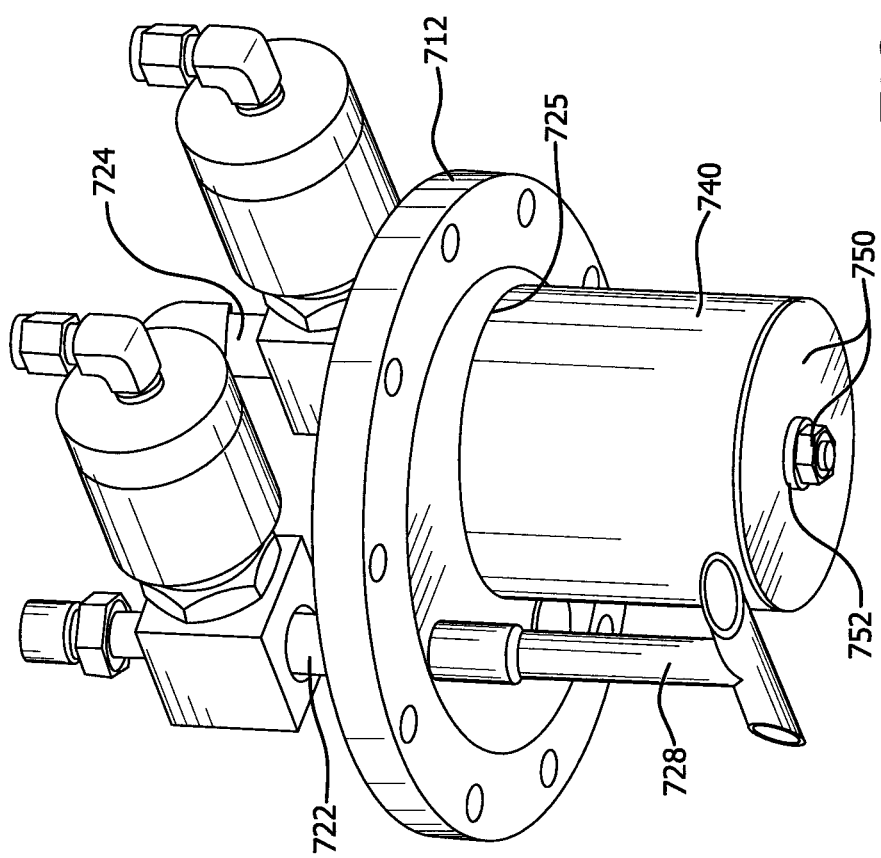
FIG. 7 is a perspective view of a lid of a vessel having a cup-shaped particle barrier attached thereto having a "T" shaped inlet tube extension.

FIG. 7 shows a portion of a vessel of the invention comprising a particle barrier 750 comprising a cup-shaped filter 740. A cross section of the cup-shaped filter 740 in FIG. 7 is further shown in FIG. 8. Cup-shaped filter 740 is mounted to the lid 712, as shown, via mechanical attachment equipment 732 (for example as shown, a bolt) attached to the lid 712. The bolt 732 has a threaded portion to which a nut 752 is attached after passing through a hole in the cup-shaped filter. When the nut 752 is tightened, the rim 725 of the cup is sealingly forced against the lid 712. In one embodiment, rim 725 may be set into a corresponding groove that is machined on the inside of lid 712 (not shown). In this or other embodiments, a gasket, o-ring, seal or other means (not shown) may be used to prevent the flow of particles into the interior volume or particle restricted space 760 of cup-shaped filter 740. Referring again to FIG. 8, a washer, which can be a locking washer or larger-sized flat washer, may also be used between the nut 752 and the cup-shaped filter 740. Alternative mechanical attachments equipment could be used. The particle barrier 750 comprises particle restricted space 760. A portion of the lid 712 and the cup-shaped filter define the particle restricted space 760. The particle restricted space 760, that is, the interior volume defined by the cup-shaped filter 740 and the lid 712 is in fluid communication with the outlet 724. Although not shown, there is a hole in the lid where outlet 724 penetrates the lid 712. Attached to the inlet 722 is an inlet "T" shaped tube extension 728. Carrier gas flows into the vessel from inlet 722 through "T" shaped tube 728 which directs the carrier gas at the sidewall (not shown). However, as described earlier the inlet (and/or outlet) may comprise or not comprise alternative extensions such as a "L", "U", or "J" or other extension or connection to direct the flow of the carrier gas into the interior volume of the vessel.

The cup-shaped filter is shown as mounted with its rim 725 adjacent to the lid 712. It was determined that this filter shape and particle barrier design provided good heat transfer from the vessel exterior walls (via the lid) to the filter, because of the increased surface contact area between the lid or other parts of the vessel and the filter. Embodiments that increase the contact surface area between the particle barrier and the sidewalls, base, and/or lid are preferred for method steps that require the addition of heat into the vessel to cause the vaporization of the precursor. The contact surface area between the particle barrier and the vessel may be 0.3 inch$^2$ or greater, or 1 inch$^2$ or greater or more.

The cup-shaped filter is shown as mounted with its rim 725 adjacent to the lid 712; however, in alternative embodiments the cup could be mounted in the opposite direction, or multiple cups could be used and/or fused together to define a particle restricted space within. In alternative embodiments, multiple particle barriers and/or a single particle barrier comprising one or multiple filters of different shapes, orientations or configurations that together define a particle restricted space that communicates with the inlet and/or outlet can be used in this invention.

Figure 12:
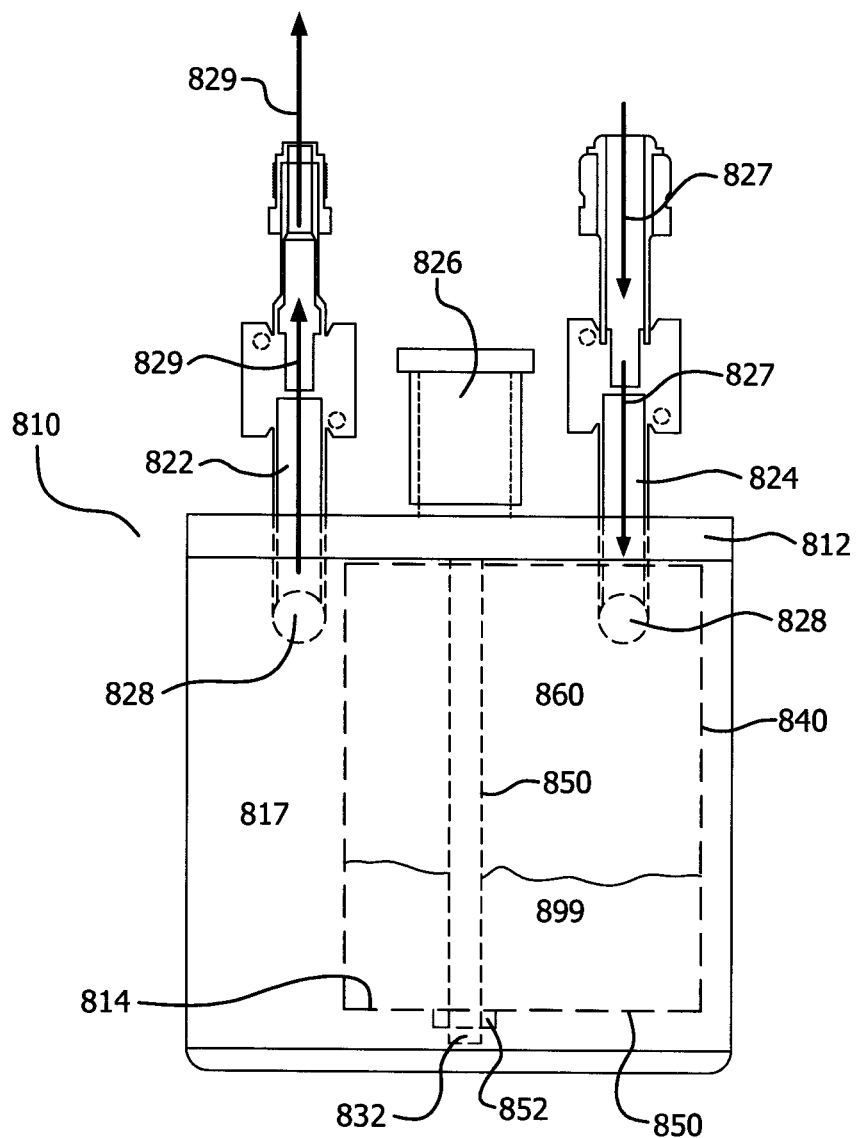
FIG. 12 provides a side view of an embodiment of a single cup-shaped particle barrier of FIG. 7 wherein the inlet gas flows initially into the cup-shaped particle barrier comprising the precursor or is the reverse carrier gas flow of FIG. 7.

FIG. 12 provides an alternative embodiment of the vessel 810 shown in FIG. 7 comprising a particle barrier 850 comprising a cup-shaped filter 840 wherein the cup-shaped filter has an interior volume or particle restricted space 860 further comprising precursor 899. FIG. 12 further shows an embodiment of a reverse flow of the carrier gas into the cup-shaped filter 840. The cup-shaped filter 840 is mounted to lid 812 via a mechanical attachment 832 and filter mounting shaft 851 in a manner similar to that shown in FIGS. 7 and 8. Carrier gas flows into cup-shaped filter 840 comprising precursor 899 through inlet 824 as depicted by arrows 827. Carrier gas flows into the vessel from outlet 824 through a "T" shaped tube 828 which directs the carrier gas into the interior volume 817 of the vessel. However, as described earlier the inlet (and/or outlet) may comprise or not comprise alternative extensions such as a "L", "U", or "J" or other extension or connection to direct the flow of the carrier gas into the interior volume of the vessel 817, filter 840, or both. Precursor 899 is heated via conduction through lid 812 or other means to provide a precursor-containing fluid stream. The pore size or openings of cup-shaped filter 840 are selected to prevent the flow of particles into interior volume 817. In certain embodiments, interior volume 817 may further comprise additional precursor 899 (not shown) outside of cup-shaped filter 840 which may be the same as the precursor in cup-shaped filter 840 or may be a different precursor provided that the vaporization or sublimation temperature is within the same range. The precursor-containing fluid stream passes through the openings in cup-shaped filter 840 into interior volume 817. The precursor-containing fluid stream then flows from interior volume 817 to outlet 822 as shown in arrows 829. Outlet 822 may extend into interior volume 822 through a "T" shaped tube 828. However, as described earlier, the inlet (and/or outlet) may comprise or not comprise alternative extensions such as a "L", "U", or "J" or other extension or connection to direct the flow of the precursor-containing fluid stream out of the interior volume 817 of the vessel. Although not shown in FIG. 12, a separate particle barrier such as, but not limited to an embodiment depicted as 590 comprising a tubular filter 580 in FIG. 6, may be in fluid communication with inlet 822 may be adopted in this or other embodiments.

FIG. 13 provides an alternative embodiment of the vessel 910 comprising a particle barrier 950 comprising a multiple cup-shaped filter 940a and 940b wherein the multiple cup-shaped filters 940a and 940b have interior volumes 960a and 960b further comprising precursors 999a and 999b, respectively. Although particle barrier 950 is depicted has having 2 cup-shaped filters 940a and 940b, it is understood that more than 2 filters (e.g., 940c through 940z or greater) may be employed. In an alternative embodiment, particle barrier 950 may comprise a tube or other shape having an interior volume within a cup such as one or more tube or tubular filters within one or more cup-shaped filter. Carrier gas flows into the particle barrier 950 and into the interior volumes of cup-shaped filters 940a and 940b from inlet 922 in the direction depicted by arrow 927. Multiple cup-shaped filters 940a and 940b are mounted to lid 912 via a mechanical attachment 932 and filter mounting shaft 951 in a manner similar to that shown in FIGS. 7 and 8. Carrier gas flows into the first of the multiple cup-shaped filter 940a comprising precursor 999a through inlet 922 as depicted by arrows 927. Carrier gas flows into the interior volume 960a from inlet 922 through a tube or other means (not shown). Precursor 999 is heated via conduction through lid 912 or other means (e.g., oven heating, thermal jackets, or other means) to provide a precursor-containing fluid stream. In certain embodiments, lid 912 can be actively heated by cartridge heaters (not shown) to improve heating to the precursor. The pore size or openings of cup-shaped filter 940a are selected to prevent the flow of particles into interior volume 960b of cup-shaped filter 940b. Cup-shaped filter 940b comprises precursor 999b which may be the same as precursor 999a or alternatively be a different precursor provided that the vaporization or sublimination temperature of the precursor is in the same range. In the embodiment shown in FIG. 13, interior volume 917 may further comprise additional precursor 999a which may be the same as the one or more precursor in cup-shaped filter 940a, 940b, or may be a different precursor provided that the vaporization or sublimation temperature is within the same range. The precursor-containing fluid stream passes through the openings in cup-shaped filters 940a into interior volume 960b which increases the amount of precursor in the precursor-containing fluid stream to provide an enriched precursor-containing fluid stream. The enriched precursor-containing fluid stream then flows from interior volume 917 which further comprises additional precursor 999c. The enriched precursor-containing fluid stream is further enriched with the vaporized or sublimed precursor stream in 999c to further enrich the enriched precursor-containing fluid stream. In an alternative embodiment, interior volume 917, 960b, or combinations thereof do not contain additional precursor. Outlet 924 is in fluid communication with a separate particle barrier 990 comprising a tubular filter 980 or particle restricted space which further prevents the flow of particles from vessel 910.

FIG. 14 provides an alternative embodiment of the vessel shown in FIG. 13 or vessel 910' wherein the flow of carrier gas is reversed as indicated by arrows 927' and 929'. Vessel 910' comprises an inlet 922' and an outlet 924'. Outlet 924' is in fluid communication with particle barrier 950' comprising a multiple cup-shaped filter 940a' and 940b' wherein the multiple cup-shaped filters 940a' and 940b' have interior volumes 960a' and 960b'. Multiple cup-shaped filters 940a' and 940b' are mounted to lid 912' via a mechanical attachment 932' and filter mounting shaft 951' in a manner similar to that shown in FIGS. 7 and 8. Cup-shaped filter 940b' further comprises precursor 999b. Although particle barrier 950' is depicted has having 2 cup-shaped filters 940a' and 940b', it is understood that more than 2 filters (e.g., 940c' through 940z' or greater) may be employed. Inlet 924' is in fluid communication with a separate particle barrier 990' comprising a tubular filter 980' or particle restricted space which further prevents the flow of particles into the interior volume 917' of vessel 910'. It is believed that particle barrier 990' distributes the carrier gas over a larger surface area and the laminar flow it provides also enhances mixing and sweeping of the gas over the precursor surface. Carrier gas flows into the particle barrier 990' and into the interior volumes of tubular filter 980' in the direction depicted by arrow 927'. The precursor 999a' is heated as described herein and contacts the carrier gas to provide a precursor-containing fluid stream. The precursor-containing fluid stream then flows through one or more openings in particle barrier 950' and enters into one or more openings of 940b' having precursor 999b' contained therein. The pore size or openings of cup-shaped filter 940b are selected to prevent the flow of particles into interior volume 917'. Cup-shaped filter 940b' comprises precursor 999b' which may be the same as precursor 999a' or alternatively be a different precursor provided that the vaporization or sublimation temperature of the precursor is in the same range. In the embodiment shown in FIG. 14, interior volume 960a' does not comprise any additional precursor. The precursor-containing fluid stream passes through the openings in cup-shaped filters 940b' into interior volume 960b' which increases the amount of precursor in the precursor-containing fluid stream to provide an enriched precursor-containing fluid stream. The enriched precursor-containing fluid stream then flows from interior volume 960a' which prevents particles from flowing out of vessel 910' through outlet 924'.

Figure 8:
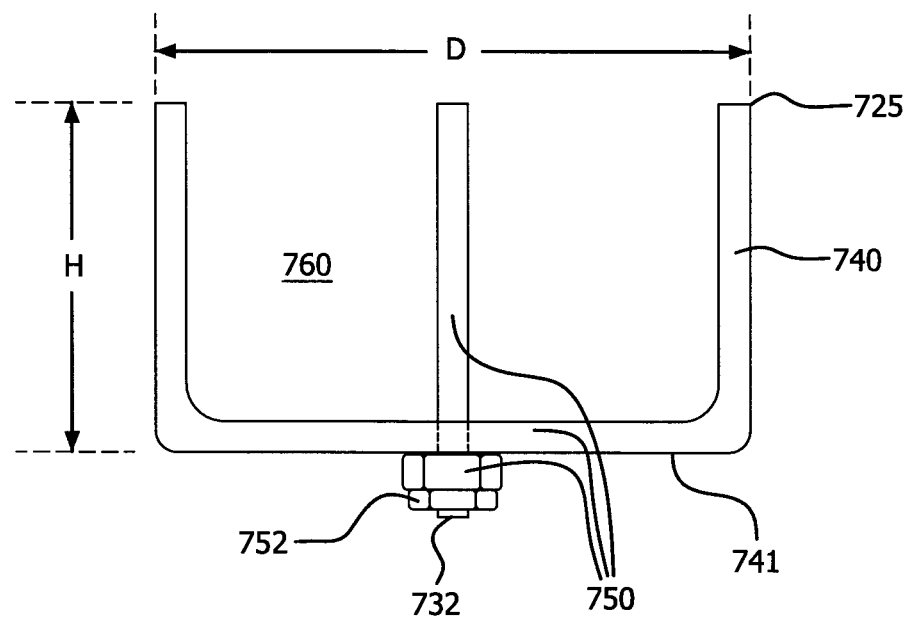
FIG. 8 is a cross-sectional view of a particle barrier comprising a cup-shaped filter.

FIG. 9 shows an embodiment of a vessel of this invention that is similar to those shown in FIGS. 7 and 8 further comprising a flow barrier 771 to prevent the carrier gas from entering the interior volume of the vessel via inlet 722 through the inlet's "T" extension 728 and flowing directly through particle barrier 750 and to the outlet 724 without first flowing towards the precursor that in many embodiments is located in the lower portion of the interior volume of the vessel and mixing with the precursor vapors to become a precursor-containing fluid stream. The flow barrier 771 shown is cylindrical, and encircles, but is spaced from, the outside surface area of particle barrier. The space between the particle barrier 750 and the flow barrier 771 provides for the flow of the precursor-containing fluid stream towards the outlet 724 by passing through the entire (outside to inside) surface area of the filter 740 into the particle restricted space. FIG. 9 shows the bottommost surface 741 of the cup-shaped filter 740.

Typical dimensions for a cup-shaped filter may be 0.25 inches to 18 inches diameter, by 0.25 inches to 12 inches height, or ¾ inches to 4 inches diameter by 1 inch to 8 inches height or 2 inches to 5 inches diameter by 2 inches to 5 inches height.

It is readily apparent that flow barriers of any shape can be used to direct the carrier gas towards the precursor and/or prevent the carrier gas from entering the outlet 724 just after leaving the inlet, before mixing with the precursor in its solid (or liquid) or gaseous form.

Particle barriers of any size and shape may be used in the vessels and method of this invention; however, for decreased pressure drop across the filter a filter having increased surface area may be preferred. The size of particle barriers, that is, the length L, width W, and height H, or for cylindrical filters, the outside diameter D and height H (these dimensions are shown in one embodiment in FIG. 5 and in another in FIG. 8) useful in this invention, is mostly limited by the portion of the interior volume 417 inside the vessel 410 not filled by the precursor 499 or other elements or parts. Examples of parts of the vessel that are present or desired to be present in the interior volume 417 of the vessel 410 (see FIG. 4) may include one or more of the following inlet 428, outlet extension 4210, heat conducting elements (34B in FIG. 2), level sensors (not shown) flow directors (not shown), flow barriers 771 (shown in FIG. 9), trays, etc. and the like. The at least one particle barrier is preferably sized to fill the portion of the interior volume space available to provide for increased or maximized surface area of the filter while still allowing for adequate carrier gas or other fluid movement and/or mixing (of for example, a carrier gas (if present) and the precursor) inside the vessel. Although not exact, the height H will define the vertical distance of the filter, and the length will be the horizontal distance parallel to the lid; therefore, for the same shaped filter in a different orientation, the height and the length may change.

It has been found for certain embodiments of this invention that the filters may have an outside diameter (or equivalent for non-circular shapes) and height or length or width and/or at least one, or at least two of, or all three of its (diameter) width, height and/or length of the filter greater than or equal to 0.5 inches, or greater than or equal to 0.75 inches, or greater than or equal to 1.00 inch, or greater than or equal than 1.5 inches, or greater than or equal to 2.0 inches, or greater than or equal to 2.5 inches, or greater than or equal to 3.0 inches, or greater than or equal to 3.5 inches, or greater than or equal to 4.0 inches, or greater than or equal to 4.5 inches or greater than or equal to 5.0 inches, or greater than or equal to 5.5 inches, or greater than or equal to 6.0 inches or greater than or equal to 6.5 inches, or greater than or equal to 7.0 inches, or greater than or equal to 7.5 inches or greater than or equal to 8.0 inches, or greater than or equal to 8.5 inches. For typical 5×5 inch vessels (typically having a cylindrical-shape), all of the filter dimensions may be less than 5 inches. The higher values in the list above are for larger vessels. The outside diameter of a tubular filter, or cup-shaped filter, or bellows-shaped filter, or the like, when the center axis of the filter that is part of a particle barrier is perpendicular to the lid, also referred to as a vertical orientation, (in this orientation the outside diameter is (equal to) its length and width) and can be greater than 25% or greater than 30% or greater than 40% or greater than 50% or greater than 75% or greater than 85% or greater than 95% of the average inside diameter of the vessel (or equivalent for non-cylindrical vessels) calculated over the entire diameter of the vessel. The height of the filter (which is the vertical distance of the filter) for any shaped filter, (or equivalent shaped filter made up of more than 1 connected filters) including the just-described tubular filter or cup-shaped filter or bellows-shaped filter may be between 2 times the thickness of the filter material to 4.5 inches or 0.5 to 4 inches or from 0.5 to 3.5 inches or from 1 to 3 inches. In a vessel that is approximately 5×5 inches, the width of a filter or the outside diameter of a cup-shaped filter, or tubular filter or bellows-shaped filter or the like may be from 1.5 to 5 inches, or from 2 to about 4.5 inches for typically sized (e.g. 5×5 inch) vessels. The height of the at least one filter may be from 0.5 to 5 inches or from 0.5 to 5 inches or from 1 to 5 inches or from 2 to 4.5 inches for typically sized (e.g. 5×5 inch) vessels. Typically the thickness of the at least one filter material is 0.11 inches or less, or 0.1 inches or less, 0.09 inches or less, or 0.08 inches or less, or 0.07 inches or less, or 0.065 inches or less, or 0.05 inches or less or 0.047 inches.

For a filter in a common sized vessel (for example a vessel having a diameter less than 6 inches) or any sized vessel, the surface area of the at least one filter through which precursor-containing fluid can flow through may be 4 square inches or greater, or 5 square inches or greater, or 7 square inches or greater, or 10 square inches or greater, or 12 square inches or greater, or 15 square inches or greater, or 20 square inches or greater, or 22 square inches or greater, or 25 square inches or greater, or 27 square inches or greater, or 30 square inches or greater, or 35 square inches or greater, or 40 square inches or greater, or 45 square inches or greater, or 50 square inches or greater, or 55 square inches or greater, or 60 square inches or greater.

For some embodiments, the one or more filters in the particle barrier are sized, such that the summation of the cross-section of all of the pores through the filter (the pores through the filter provide for the passage of the gas) is at a minimum at least 25%, or at least 50%, or at least 75%, or at least 90%, or at least approximately equivalent to or larger than, or larger than 100%, or at least 110%, or at least 120%, or at least 150%, or at least from 100% to 10000%, or at least from 105% to 5000%, or 110 to 500%, of the smallest cross-sectional area of the inlet or outlet pipes (measured within 2 inches of where the gas exits or enters the inlet or outlet pipe into or out of the interior volume of the vessel). By sizing the filter(s) to provide enough pores (total open cross-sectional surface area) through the filter(s) through which the gases can flow, such filters will provide for lower pressure drop across the filter(s) of the one or more particle barriers, relative to smaller filters used in the same vessel. If the pressure drop across the filter is kept to a minimum, the flow will not be restricted through the particle barrier and additional energy (for example, heat) will not have to be introduced into the vessel to increase the flow rate of the precursor-containing fluid stream.

It is preferred to provide filter(s) with relatively high surface areas so that the pressure drop across the particle barrier can be kept relatively low. In some embodiments, the pressure drop across the particle barrier comprising one or more filters is less than 80 torr, or less than 60 torr or less than 50 torr, or less than 40 torr, or less than 30 torr, or less than 20 torr for the flow of the gaseous precursor-containing fluid stream. These pressure drops can be maintained for flow rates through the vessel from 1 to 4000 standard cubic centimeters (sccm), or from 1000 to 3000 sccm, or 1000 to 2500 sccm, or about 1500 sccm of the precursor fluid stream through the vessel. Lower pressure drop across the particle barrier is desirable to lower the operating pressure of the vessel. A lower operating pressure will provide an increased precursor vaporization rate. For vapor delivery applications where the vessel is heated such that the precursor chemicals are at or near their thermal decomposition temperature, lowering the operating pressure will allow for the operating temperature to be lowered, while still maintaining the same flow rate. A lower operating temperature will avoid the degradation of the precursor that would be caused by high operating temperatures.

In some embodiments, the Volume Filter Design factor, which is defined as the surface area of filter in square inches divided by the internal volume of the vessel in cubic inches, may be greater than or equal to 0.08 $inch^{-1}$, or greater than or equal to 0.1 $inch^{-1}$, or greater than or equal to 0.12 $inch^{-1}$, or greater than or equal to 0.15 $inch^{-1}$, or greater than or equal to 0.17 $inch^{-1}$, or greater than or equal to 0.2 $inch^{-1}$, or greater than or equal to 0.21 $inch^{-1}$, or greater than or equal to 0.22 $inch^{-1}$ or greater than or equal to 0.23 $inch^{-1}$ or greater than or equal to 0.24 $inch^{-1}$, or greater than or equal to 0.25 $inch^{-1}$, or greater than or equal to 0.25 $inch^{-1}$, or greater than or equal to or equal to 0.3 $inch^{-1}$. For example, a cup shaped filter with a 2.5 inch diameter and 2.6 inch height in a typical 5 inch diameter by 5 inch height container, would have a Volume Filter Design Factor of 25.4 square inches divided by the container volume of 98 cubic inches or approximately 0.26 $inch^{-1}$.

In some embodiments, the Area Filter Design Factor, which is defined as the surface area of the filter divided by the average cross-sectional area of the interior of the vessel may be greater than or equal to 0.3, or greater than or equal to 0.4, or greater than or equal to 0.5, or greater than or equal to 0.6, or greater than or equal to 0.7, or greater than or equal to 0.8, or greater than or equal to 0.9, or greater than or equal to 1, or greater than or equal to 1.1 or greater than or equal to 1.2, or greater than or equal to 1.3, or greater than or equal to 1.5, or greater than or equal to 1.7, or greater than or equal to 2.

The at least one filter can be made of any material that is non-reactive with the carrier and/or the precursor molecules. The at least one filter may have a pore size (mean pore size) that ranges from 0.1 to 100 microns, that is, micrometers (μM). The pore sizes may correspond to the "media grade" of a filter, and for some filters the media grade of a filter may correspond to the particle size that the filter can capture at 99.9% capture efficiency. Useful filter(s) in this invention can be one(s) that is (are) rated for greater than 90% capture efficiency or greater than 99% capture efficiency or greater than 99.9% capture efficiency for 20 μM size particles or 10 μM size particles, or 5 μM size particles or 2 μM size particles. (For the filters, the capture efficiencies for larger particles than they are rated for, will be greater. For example, if the capture efficiency for a filter for 1 μM size particles is 90%, then the capture efficiency for 1.5 μM size particles will be greater than 90%.) In some embodiments, the filter provides for 99.9% capture efficiency for particles of 1 μM size or 0.7 μM size. Other useful filters have a pore size or media grade of 0.5 to 5 (μM), for example 0.5, 1, 2 or 5 (μM). The mean pore size and/or the particle capture efficiency(ies) for the one or more filters used to make the particle barrier depend on the presence and size of the particles in the precursor containing fluid stream and the downstream process conditions.

The material used for construction of the filter can be porous metal, carbon, ceramic, Teflon, fiberglass, typically metal or metal alloy. In one embodiment the filter is a 316L stainless steel filter fabricated from porous sheet material having a thickness of 0.047 inches, and having 99.9% efficiency for particles of 0.7 µM size, 99.0% efficiency for particles of 0.35 µM and 90% efficiency for all particle sizes, and with a bubble point of 2.0-2.5 Hg. In alternative embodiments, multiple filters of varying pore sizes, media grade or capture efficiencies can be used.

In addition to the tubular filter shown in FIGS. 4, 5 and 6, the bellow-shaped filter shown in FIG. 6 and the cup-shaped filter shown in FIGS. 7, 8 and 9, the one or more filters of this invention can have any shape including a square, cube, cone, hockey puck and tubular loop or any other shape or combination of shapes as long the one or more filters at least partially defines a particle restricted space and having sufficient surface area and the required particle capture efficiency to provide an acceptable flow and pressure drop across the filter to meet the process requirements. In some embodiments, the particle barriers of this invention comprise three-dimensional filters or filters equivalent to 3-dimensional. Stated differently in some embodiments, the one or more filters may define more than one directional boundary of the particle restricted space where the remaining boundary(ies), if any, are defined by a part of the vessel or a support or other element of the particle barrier.

In some embodiments in which multiple particle barriers are used in a vessel, with a first particle barrier defining a particle restricted space in fluid communication with the outlet and a second particle barrier in fluid communication with the inlet, (and each particle barrier may comprise one or more filters) the at least one filter that is part of the particle barrier in fluid communication with the outlet may have a larger surface area and thereby a larger Volume Filter Design Factor and larger Area Filter Design Factor relative to the one or more filters that are part of the particle barrier in fluid communication with the inlet. The reason being that the pores of the filter in communication with the outlet will likely become blocked with many more particles from the precursor-containing fluid stream due to the flow of the precursor-containing fluid stream to the outlet.

This invention also provides a method for dispensing a precursor-containing fluid stream comprising a gaseous phase of a precursor from a vessel, the method comprising: providing a vessel having at least one particle barrier; vaporizing a precursor to form the fluid stream; passing said fluid stream through said at least one particle barrier from said interior volume outside the particle restricted space into said particle restricted space wherein said at least one particle barrier prevents particles in said fluid stream from passing into the particle restricted space and exiting the vessel with said precursor-containing fluid stream.

In another embodiment is provided a method for dispensing a precursor-containing fluid stream comprising a gaseous phase of a precursor from a vessel, the method comprising: providing a vessel having a vessel interior and at least one particle barrier defining a particle restricted space inside said interior volume; vaporizing a precursor to form the fluid stream; passing a carrier gas through said at least one particle barrier, wherein said at least one particle barrier prevents particles from passing into the particle restricted space. The particle barrier comprises one or more filters, said one or more filters each having a capture efficiency rating and said particles are captured by each filter according to said capture efficiency rating.

In another embodiment is provided a method for dispensing a precursor-containing fluid stream comprising a gaseous phase of a precursor from a vessel, the method comprising: providing a vessel having a vessel interior volume with a precursor in said interior volume and at least one particle barrier defining at least a portion of a particle restricted space inside said interior volume; vaporizing and/or subliming the precursor to form a fluid stream; passing said fluid stream through said at least one particle barrier, wherein said at least one particle barrier prevents particles from passing into the particle restricted space.

In any of the just described embodiments, the particle restricted space can include one or more outlets for the precursor-containing fluid stream, or one or more inlets for the carrier gas, or there can be a particle restricted space on one or more outlets for the precursor-containing fluid stream and on one or more inlets for the carrier gas.

In another embodiment, described with reference to FIG. 4, the method of using the vessel disclosed herein includes introducing a precursor material through fill port 426, such as a solid precursor material, into the interior volume 417 of vessel 410 wherein the solid precursor material may be heated and/or may contact one or more protrusions 34 (shown in FIG. 2) that extend into the interior volume 417. If protrusions are present it is preferable that the precursor material is filled to the point where it is in continuous contact with at least a portion of the at least one protrusion and does not extend beyond the area of the interior volume 417 containing the at least one protrusion. Lid 412, base 414, and sidewall 416 are fastened to provide a pressure-tight or airtight seal. If present, valve 423 may be opened to allow for the flow of an inert carrier gas into interior volume 417 that may flow through inlet extensions before entering the vessel. A heating source such as heating cartridges or heating jacket or hot plate may be used to bring the precursor material to sublimation or vapor temperature and form a precursor gas. The inert carrier gas, if present, combines with the precursor gas to form the precursor-containing fluid stream. The precursor-containing fluid stream passes through particle barrier 440 into the particle restricted space and into outlet 424 to a downstream production device such as a reaction chamber used for thin film deposition, said particle barrier prevents the passage of particles from the vessel into the outlet and to the downstream production device.

In alternative embodiments of the method of this invention, the carrier gas if present may flow into and through at least one particle restricted space that is defined by at least one particle barrier that is in fluid communication with the at least one inlet, and the precursor-containing fluid stream in the interior volume of the vessel may flow into and through at least one particle barrier into at least one particle restricted space that is in fluid communication with the at least one outlet.

This invention also provides a method for dispensing a precursor-containing fluid stream comprising a gaseous phase of a precursor from a vessel, the method comprising: providing a vessel having an interior volume, and a precursor material in said interior volume; heating the precursor under conditions to sinter loose precursor particles into a solid; vaporizing the precursor to form a precursor-containing fluid stream; and exiting the vessel with said precursor-containing fluid stream.

This invention also provides a method for dispensing a precursor-containing fluid stream comprising a gaseous phase of a precursor from a vessel, the method comprising: providing a vessel having an interior volume, and at least one particle barrier in said interior volume; introducing a precursor material into said interior volume; heating the precursor under conditions to sinter loose precursor particles into a solid; vaporizing the precursor to form a precursor-containing fluid stream; passing said fluid stream through said at least one particle barrier from said interior volume into said particle restricted space wherein said at least one particle barrier prevents particles (greater than a certain size) in said fluid stream from passing into the particle restricted space and exiting the vessel with said precursor-containing fluid stream.

Sintering the precursors may reduce the amount of solid particles entering the fluid stream during precursor vaporization and thus reduces the load on the filter of the particle barrier. Sintering the precursor is conducted at one or more temperatures below the melting point of the precursor for a period of time long enough to bind together loose solid particles of the precursor. During sintering, the vessel pressure may be maintained between 1 psia and 100 psia to promote the binding together of the loose solid particles of the precursor material. The sintering may be conducted under static or dynamic inert gas flow. Sintering conditions are selected for each precursor depending on the precursor's physical properties, such as melting point and vapor pressure, and precursor's particles' morphology. The sintering step may be performed prior to shipping the precursor vessel to the end-user, and therefore, before putting the vessel on the tool. Alternatively, the sintering step may be performed on the tool prior to creating the precursor-containing fluid stream.

Alternatively instead of sintering the precursor, this invention includes the method of: after introducing solid precursor material into the vessel; heating the precursor in the vessel under conditions to allow the solid precursor to melt; and cooling the precursor below the precursor's melting point to form a solid. Those steps may be performed before vaporizing the precursor to form the fluid stream in accordance with any of the methods described herein. Melting and crystallizing solid precursors, like the sintering step may reduce the amount of fine solid particles entering the fluid stream during precursor vaporization and thus reducing the load on the particle barrier, which helps to maintain the pressure drop, and thereby prevent an increase in pressure drop, across the particle barrier. In alternative embodiments, the solid precursor may be introduced into the vessel (through a fill-port for example). This invention also provides a method for dispensing a precursor containing fluid stream comprising a gaseous phase of a precursor from a vessel, the method comprising providing or introducing solid precursor dissolved in a solvent into a vessel; thereafter heating the precursor under conditions sufficient to remove residual solvent to form a solid material; optionally the precursor can be cooled, for example, to a temperature below its melting point; and then the vessel can be used to vaporize the precursor to form the precursor-containing fluid stream. The sintered, melted or solvent deposited solid precursors can be used in the vessels described herein having the particle barriers or can be used in any vessel or method known to a person of ordinary skill in the art with or without a carrier gas. The vessels and methods of this invention will be illustrated in more detail with reference to the following examples, but it should be understood that the present invention is not deemed to be limited thereto.

EXAMPLES

Comparative Example 1

Particle Test of Tantalum Chloride Vessel with No Particle Barriers

In the glove box 200 g of tantalum chloride was loaded into 1.2 liter (L) stainless steel (SS) vessel equipped with an inlet tube angled 90 degrees directing inlet gas flow toward the sidewall of the vessel. The vessel was also equipped with the fill port and valves coupled to inlet and outlet tubes. No internal filters were used in this vessel. The vessel was heated for six hours at 160° C. to sinter the tantalum chloride powder.

The vessel with tantalum chloride powder therein was installed on a particle test system designed to measure gas-borne particles exiting the outlet port when inert carrier gas is introduced into the vessel via an inlet port. The test system comprised a metered $N_2$ supply system, a bypass line around the vessel, a metered sample line to the optical particle counter (OPC), a vacuum line, and an excess flow vent line. Point of use filters were used to filter the incoming $N_2$, the sample gas after the particle counter, and the excess vent gas. Pre-calibrated rotometers and flow control valves were used to measure and control the $N_2$ flow rate to the vessel and OPC during testing. A Particle Measuring Systems (PMS), Inc. model CGS-M100 gas OPC was used for these tests. The instrument measured all gas-borne particles having equivalent optical diameters larger than 0.16 µm and has four particle size channels, 0.16 µm, 0.2 µm, 0.3 µm and 0.5 µm. Tests were performed at a $N_2$ flow rate of approximately 500 cm$^3$/minute through the vessel having the tantalum chloride therein. 19 sccm of vessel exit flow was split into OPC and the excess flow was vented via vent line. The low particle count rate of the OPC in the filtered $N_2$ was first confirmed by flowing the filtered $N_2$ through the vessel bypass line. The instrument indicated 0 particles/cm$^3$ in the filtered $N_2$.

The particle test was performed during 15 min after opening the vessel to 500 cm$^3$/minute nitrogen flow. During this time approximately 15×500=7,500 cm$^3$ $N_2$ flowed through the vessel, and approximately 285 cm$^3$ of that $N_2$ stream was sampled by the OPC. The particle count rate data obtained during this period are listed below.

Results of Comparative Example 1

| Size, µm | Differential Particles Counted | Accumulative Particles Counted | Differential Particles per cm$^3$ | Accumulative Particles per cm$^3$ |
| --- | --- | --- | --- | --- |
| 0.16 | 364,672 | 1,135,608 | 1,280 | 3,985 |
| 0.2 | 626,509 | 770,936 | 2,198 | 2,705 |
| 0.3 | 129,877 | 144,427 | 456 | 507 |
| 0.5 | 14,550 | 14,550 | 51 | 51 |

The data indicate that a total of 1,113,608 particles were registered in all size channels >0.16 µm. This corresponds to 3,985 particles/cm$^3$>0.16 µm.

The particle test was repeated after a 30 minute purge with nitrogen flowing at 500 cm$^3$/minute through the vessel. However, the total amount of particles was still >1000/cm$^3$.

Results of Comparative Example 2

| Size, μm | Differential Particles Counted | Accumulative Particles Counted | Differential Particles per cm³ | Accumulative Particles per cm³ |
|---|---|---|---|---|
| 0.16 | 155,639 | 317,782 | 546 | 1,115 |
| 0.2 | 147,074 | 162,143 | 516 | 569 |
| 0.3 | 14,590 | 15,069 | 51 | 53 |
| 0.5 | 479 | 479 | 2 | 2 |

Example 1

Using a Particle Barrier of the Invention

A particle test of tantalum chloride vessel with the SS tubular particle barrier (filter) installed on the outlet was performed.

As described for Example 1, in the glove box 200 g of tantalum chloride was loaded into 1.2 L SS vessel equipped with a 90 degree elbow fitting inside the vessel on the inlet angled about 90 degrees relative to an vertical axis of the vessel, the only difference being that the outlet tube was equipped with a SS tubular particle barrier mounted on the outlet in the vessel interior as shown in FIG. 4. As in Example 1, the vessel was also equipped with the fill port through the lid and valves coupled to inlet and outlet tubes on the exterior of the vessel.

The tubular filter had a length of 3.3 inch, and a diameter of ¾ inch and a filter material thickness of 0.070 inch. The tubular filter was made by Mott Corporation and had a media grade of 1 and a particle capture efficiency of 99.9% at a 0.7 micrometer (μm) particle size, 99% for 0.35 micrometer (μm) particle size and 90% for all particle sizes. The surface area of the filter was 7.8 square inches. The volume design factor was 0.09 inch-1 for the filter in the vessel and was calculated as follows: Filter surface area of 7.8 square inch divided by container volume of 87.9 cubic inches.

The area design factor was 0.4 for the filter in the vessel and was calculated as follows: Area Design Factor=filter area of 7.8 square inch divided by the container cross sectional area of 19.6 square inch.

The vessel was heated for six hours at 160° C. to sinter tantalum chloride powder.

The vessel with tantalum chloride powder was installed on particle test system designed to measure gas-borne particles exiting the outlet port when inert carrier gas is introduced into the vessel via an inlet port. The test system comprised a metered $N_2$ supply system, a bypass line around the vessel, a metered sample line to the optical particle counter (OPC), a vacuum line, and an excess flow vent line. Point of use filters were used to filter the incoming $N_2$, the sample gas after the particle counter, and the excess vent gas. Pre-calibrated rotometers and flow control valves were used to measure and control the $N_2$ flow rate to the vessel and OPC during testing. A Particle Measuring Systems (PMS), Inc. model CGS-M100 gas OPC was used for these tests. The instrument measured all gas-borne particles having equivalent optical diameters larger than 0.16 μm and has four particle size channels, 0.16 μm, 0.2 μm, 0.3 μm and 0.5 μm. Tests were performed at a $N_2$ flow rate of approximately 500 cm³/minute through the tantalum chloride containing vessel. 19 sccm of vessel exit flow was split into OPC and the excess flow was vented via vent line. The low particle count rate of the OPC in the filtered $N_2$ was first confirmed by flowing the filtered $N_2$ through the vessel bypass line. The instrument indicated 0 particles/cm³ in the filtered $N_2$.

The particle test was performed during 15 min after opening the vessel to 500 cm³/minute nitrogen flow. During this time approximately 15×500=7,500 cm³ $N_2$ flowed through the vessel, and approximately 285 cm³ of that $N_2$ stream was sampled by the OPC. The count rate data obtained during this period are listed below.

Results of Example 1

| Size, μm | Differential Particles Counted | Accumulative Particles Counted | Differential Particles per cm³ | Accumulative Particles per cm³ |
|---|---|---|---|---|
| 0.16 | 147 | 280 | 0.5 | 1.0 |
| 0.2 | 125 | 133 | 0.4 | 0.5 |
| 0.3 | 8 | 8 | 0.0 | 0.0 |
| 0.5 | 0 | 0 | 0.0 | 0.0 |

The data indicate that a total of 280 particles were registered in all size channels >0.16 μm. This corresponds to ~1 particle/cm³>0.16 μm. Thus installing the tubular particle barrier (filter) on the outlet of vessel reduced particles in the carrier gas by more than 3000 times in the first 15 minutes after vessel opening.

The particle test was repeated after a 30 minute purge with nitrogen flowing at 500 cm³/minute through the vessel. The count data obtained during this period is reported below:

Results of Example 1

| Size, μm | Differential Particles Counted | Accumulative Particles Counted | Differential Particles per cm³ | Accumulative Particles per cm³ |
|---|---|---|---|---|
| 0.16 | 168 | 446 | 0.6 | 1.6 |
| 0.2 | 223 | 278 | 0.8 | 1.0 |
| 0.3 | 52 | 55 | 0.2 | 0.2 |
| 0.5 | 3 | 3 | 0.0 | 0.0 |

The data indicates that a total of 446 particles were registered in all size channels >0.16 μm. This corresponds to ~2 particle/cm³>0.16 μm. Thus installing the tubular particle barrier (filter) on the outlet of vessel reduced particles in the carrier gas by approximately 1000 times.

Example 2

Sintering pentakis(dimethylamido)tantalum (PDMAT) in the vessel was performed as follows:

In the glove box 200 g of PDMAT was loaded into 1.2 L SS vessel equipped with a 90 degree elbow fitting inside the vessel on the inlet angled about 90 degrees relative to an axis of the vessel, and an outlet tube equipped with a SS tubular filter (particle barrier). The vessel was also equipped with the fill port and exterior valves coupled to inlet and outlet tubes. The vessel was heated for 4 hours at 90° C. under 1 psig of nitrogen to sinter PDMAT powder. After this sintering procedure the solid was inspected by rotating the vessel 120 degrees to observe for the presence of any loose particles, Loose powder was not observed. The loose powder was sintered into a solid cake by this procedure.

Example 3

Sintering pentakis(dimethylamido)tantalum (PDMAT) in the vessel was performed as follows:

Example 2 was repeated except the vessel was heated for 16 hours at 80° C. under 80 psig of nitrogen to sinter the PDMAT powder. After this sintering procedure the solid was inspected by rotating the vessel 120 degrees to observe for the presence of any loose particles. Loose powder was not observed; it was sintered into a solid cake during this procedure.

Example 4

Sintering pentakis(dimethylamido)tantalum (PDMAT) in the vessel was performed as follows. Example 2 was repeated except the vessel was heated for 16 hours at 80° C. under 200 sccm of nitrogen to sinter the PDMAT powder. After this sintering procedure the solid was inspected by rotating the vessel 120 degrees to observe for presence of any loose particles. No Loose powder was observed; it was sintered into a solid cake during this procedure.

Example 5

Pressure Drop Tests

The addition of an internal filter to create a particle barrier inside a vessel having a precursor therein can reduce or eliminate the particles in the outlet precursor-containing fluid stream. It is also desirable to have minimal pressure drop to avoid the need to modify the existing process tool flow and temperature parameters. And for vessels where the method of vaporizing and/or subliming of the precursor chemicals is being performed at, or near, the thermal decomposition temperature of the precursors, being able to lower the pressure in the vessel will allow the operating temperature to be lowered while maintaining the same flow rate of the precursor-containing fluid exiting the vessel and thereby extending the shelf-life of the precursor.

Two new particle barriers and filter designs were evaluated for pressure drop across the filter with flow testing, and the results compared against flow test results for the same vessel having a Prior Art Filter therein.

The first new particle barrier design tested comprised a ¾" diameter 3.3" long tubular shaped filter formed of sintered metal, 316L SS from Mott Corporation. The media grade was 1. The particle capture efficiency was 99.9% at a 0.7 micrometer (μm) particle size, 99% for 0.35 micrometer (μm) particle size and 90% for all particle sizes. The thickness of the filter was 0.070 inch. The total outer surface area of this tubular filter element was 7.8 inch$^2$. This filter design includes a holder to attach the element to the lid, and a fastener sealing mechanism to secure the filter element to the holder. Attachment of the holder to the lid is accomplished by welding the ⅜" outlet tube to the lid. The vessel used had a volume of 88 cubic inch. The volume design factor was 0.089 inch$^{-1}$. The area design factor was 0.4.

The second filter design tested comprised cup-shaped filters formed from sintered metal and were commercially available from Mott Corporation.

Several cup-shaped filters were tested that were made of 316L SS having a media grade of 0.1, 0.2, 0.5 and 1.0 in accordance with Mott Corporation's brochure. The media grade 0.1 filter had a particle capture efficiency of greater than 99.9% for all particle sizes. The media grade 0.2 filter had a particle capture efficiency of 99.9% for a 0.2 micrometer (μm) particle size, and 99% for all particle sizes. The media grade 0.5 filter had a particle capture efficiency of 99.9% for a 0.3 micrometer (μm) particle size, and 99% for a 0.25 micrometer (μm) particle size and 90% for all particle sizes. The capture efficiencies for the media grade 1 filter were described above. The cup-shaped filters had an outer diameter of 2.60 inches and a height of 2.5 inches, and the total outer surface area of 25.4 inch$^2$. The open end of the cup was forcibly sealed against the lid as shown in FIG. 7.

Figure 10:
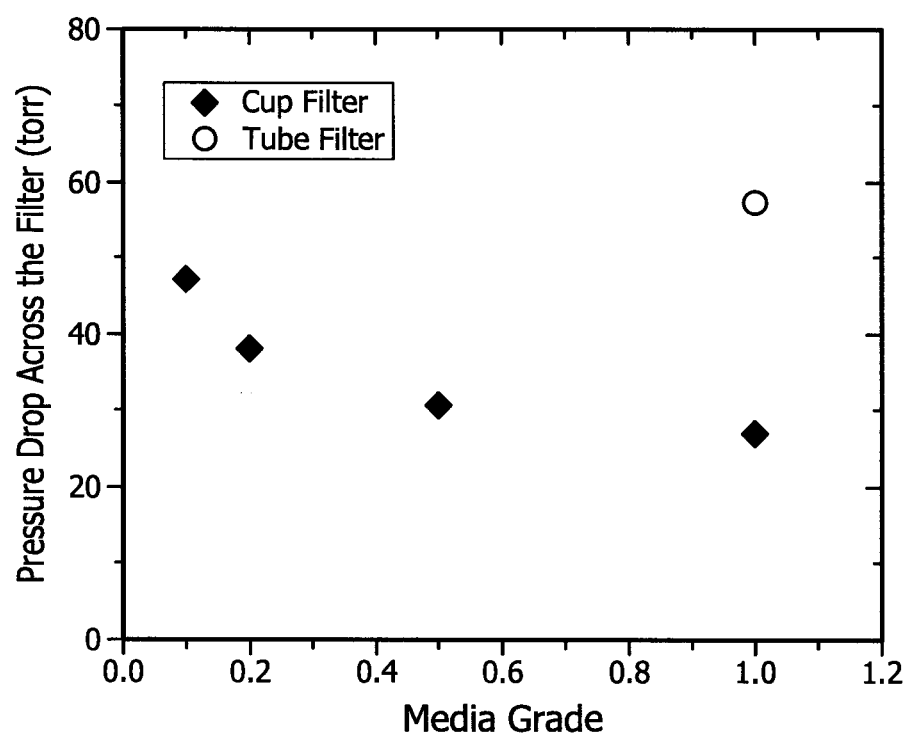
FIG. 10 is a graph of pressure drop across the filter of a particle barrier, where the filters are cup-shaped filters of various media grades and a tubular filter.
Figure 11:
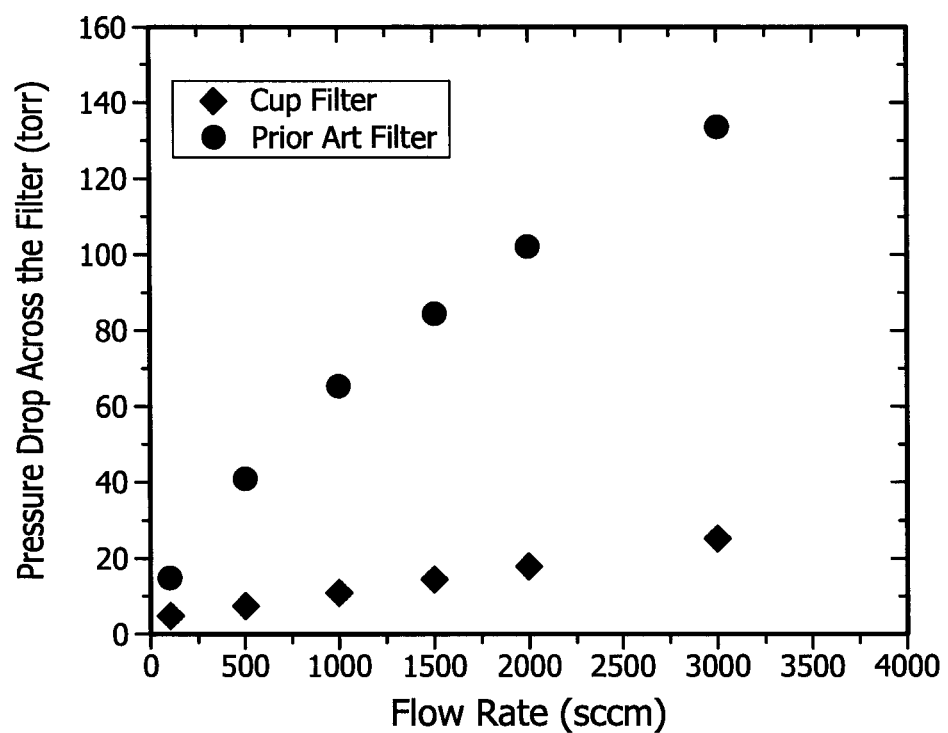
FIG. 11 is a graph of pressure drop across the filter for a cup-shaped filter vs a flat disk prior art filter at various flow rates.

The Prior Art Filter tested was a flat disk filter that had a surface area estimated to be 0.8 inch$^2$. The testing conditions were as follows:

Pressure of the N$_2$ mass flow controller (MFC) up stream of the vessel=5 psig and MFC Flow=1500 sccm N$_2$
Test System Down Stream Pressure of the vessel=Vacuum
Temperature=Ambient FIGS. 10 and 11 show the results of the pressure drop for the filters tested. The pressure drop data for the cup-shaped vs the tubular filters as well as the cup-shaped filter vs the Prior Art Filter demonstrated that the new particle barrier and filter designs improved the flow over a Prior Art Filter. The large surface areas of the filters of this invention, e.g. the tubular filter and the cup-shaped filters, provided for low pressure drop across the filters used in this invention at the same flow rates as the Prior Art Filter. The cup-shaped filter provided lower pressure drop as compared to the tubular filter design, suggesting that cup filter may offer better performance in some embodiments. Considering the greater surface area of the cup-shaped filters tested, and the increased surface area in contact with the lid of the vessel providing for increased heat transfer between the cup-shaped filter and the vessel walls, the cup-shaped filter is expected to have improved flow rates and lower pressure drop relative to other filter designs tested. Those learnings can be applied to alternate particle barrier designs which are within the scope of this invention.

Example 6

Computer Flow Modeling of Cup-Shaped Filter

Computer flow modeling was conducted of a cup-shaped filter such as that shown in FIG. 7. The operating conditions that were presented in the model were as follows: temperature of approximately 95° C.; pressure of approximately 30 torr; inlet condition of 1 lpm nitrogen 95° C. for 1.5 second and hold for 4 second; outlet condition change in pressure of 20 torr. The model further includes the flow resistance of the filter which was linearly proportional to the local flow rate. The scope of the computer modeling analyzed the following: conduct steady state analysis under inlet condition of 1 lpm N$_2$ 95° C.; compare high and low load filling levels of the vessel; and compare original inlet "T" design and no "T" alternative.

The filter effect was observed to be the following. The velocity dependent nature of cup filter resistance has been taken into consideration in the computer model. The velocity was found to be very uniform at filter inner surfaces during the simulation, and all flow within the vessel was seen to be laminar throughout. Results from all cases have similar observations.

While the invention has been described in detail and with reference to specific examples and embodiments thereof, it will be apparent to one skilled in the art that various changes and modifications can be made therein without departing from the spirit and scope thereof.

The invention claimed is:

1. A method for dispensing a precursor-containing fluid stream comprising a gaseous phase of a precursor from a vessel, the method comprising:

providing a vessel comprising an interior volume defined by a top, one or more sidewalls, and a base; said vessel having a precursor in the interior volume and at least one fluid outlet for vaporized precursor, said vessel having at least one particle barrier that defines at least part of at least one particle restricted space within the interior volume, wherein said at least one particle barrier comprises at least one 3-dimensional filter;

vaporizing the precursor to form the fluid stream, wherein said at least one particle barrier prevents particles in said fluid stream from passing into the at least one particle restricted space wherein prior to said vaporizing step the solid precursor is prepared in a vessel, by any one or more of the following preparing steps: (a) heating the precursor under conditions to sinter loose precursor particles into a solid; (b) heating the precursor under conditions to allow the solid precursor to melt and cooling the precursor below the precursor's melting point to form a solid; (c) introducing the precursor dissolved in a solvent into the vessel; and heating the precursor under conditions sufficient to remove residual solvent to form a solid.

2. The method of claim 1, further wherein said at least one particle restricted space is in fluid communication with the at least one outlet and in particle restricted fluid communication with the remainder of the interior volume and further comprising after the vaporizing step, the steps of:

passing said fluid stream through said at least one particle barrier from said interior volume into said at least one particle restricted space; and exiting the vessel with said fluid stream through the at least one outlet.

3. The method of claim 1, further comprising the step of:

introducing at least one carrier gas into the vessel through at least one inlet wherein the at least one carrier gas and the gaseous phase of the precursor combine to form the fluid stream.

4. The method of claim 3 further comprising the step of flowing the at least one carrier gas through at least one second particle restricted space in fluid communication with said at least one inlet, said second particle restricted space comprising at least one particle barrier located in the interior volume of said vessel.

5. The method of claim 3 wherein said precursor is located at or near the base of said container and said carrier gas flows from said at least one inlet that passes through the lid towards the base of the vessel.

* * * * *